US009008982B2

(12) United States Patent
Tziouvaras

(10) Patent No.: US 9,008,982 B2
(45) Date of Patent: Apr. 14, 2015

(54) SYSTEMS AND METHODS FOR DETERMINING RESIDUAL FLUX IN A POWER TRANSFORMER

(75) Inventor: Demetrios A. Tziouvaras, Vacaville, CA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 544 days.

(21) Appl. No.: 13/416,995

(22) Filed: Mar. 9, 2012

(65) Prior Publication Data
US 2013/0238267 A1 Sep. 12, 2013

(51) Int. Cl.
G06F 19/00 (2011.01)
G01R 31/02 (2006.01)
G01R 33/12 (2006.01)

(52) U.S. Cl.
CPC .............. *G01R 31/027* (2013.01); *G01R 33/12* (2013.01)

(58) Field of Classification Search
CPC ......... G01R 27/26; G01R 33/02; H02H 9/002
USPC ........... 702/65; 307/113; 361/35, 36, 76, 131, 361/132, 124
See application file for complete search history.

(56) References Cited

U.S. PATENT DOCUMENTS

| | | | |
|---|---|---|---|
| 2,209,810 A | 7/1940 | Cordroy | |
| 3,401,304 A * | 9/1968 | Woodworth | 361/17 |
| 3,546,534 A | 12/1970 | Kotos | |
| 3,558,984 A | 1/1971 | Smith | |
| 3,684,948 A * | 8/1972 | Eissmann | 323/340 |
| 3,870,926 A * | 3/1975 | Hughes | 361/16 |
| 4,322,768 A | 3/1982 | Maeda | |
| 4,327,390 A * | 4/1982 | Despiney | 361/16 |
| 4,329,638 A * | 5/1982 | Le Maguet | 323/233 |
| 4,757,263 A | 7/1988 | Cummings | |
| 4,914,382 A | 4/1990 | Douville | |
| 5,367,426 A | 11/1994 | Schweitzer, III | |
| 5,418,776 A | 5/1995 | Purkey | |
| 5,430,599 A | 7/1995 | Charpentier | |
| 5,563,459 A * | 10/1996 | Kurosawa et al. | 307/141.4 |
| 5,627,415 A | 5/1997 | Charpentier | |

(Continued)

OTHER PUBLICATIONS

Three Phase Electric Power, available at http://en.wikipedia.org/wiki/three-phase_electric_power on Mar. 2, 2011.

(Continued)

*Primary Examiner* — Carol S Tsai
(74) *Attorney, Agent, or Firm* — Stoel Rivers LLP; Richard M. Edge

(57) ABSTRACT

The present disclosure provides systems and methods for calculating the flux in a core of an unloaded power transformer using current measurements taken from a capacitance-coupled voltage transformer (CCVT) attached to the same phase line as the power transformer. According to various embodiments, the current sensors may both be positioned at zero-voltage points in the CCVT, eliminating the need for high-voltage insulated current sensors. An intelligent electronic device (IED) may determine the magnetic flux within the core of the power transformer using the measured and/or derived currents through capacitive assemblies of the CCVT. The IED may calculate the residual flux in the power transformer when it is de-energized. The IED may use the calculated residual flux to facilitate an optimized re-energization of the power transformer, thereby reducing inrush currents during re-energization.

27 Claims, 20 Drawing Sheets

(56) References Cited

U.S. PATENT DOCUMENTS

| | | | |
|---|---|---|---|
| 5,671,112 A | 9/1997 | Hu | |
| 5,703,745 A | 12/1997 | Roberts | |
| 5,805,395 A | 9/1998 | Hu | |
| 6,028,754 A | 2/2000 | Guzman | |
| 6,256,592 B1 | 7/2001 | Roberts | |
| 6,341,055 B1 | 1/2002 | Guzman-Casillas | |
| 6,356,421 B1 | 3/2002 | Guzman-Casillas | |
| 6,392,390 B1* | 5/2002 | Ito et al. | 323/209 |
| 6,456,947 B1 | 9/2002 | Adamiak | |
| 6,493,203 B1* | 12/2002 | Ito et al. | 361/159 |
| 6,518,767 B1 | 2/2003 | Roberts | |
| 6,571,182 B2 | 5/2003 | Adamiak | |
| 6,590,397 B2 | 7/2003 | Roberts | |
| 6,879,917 B2 | 4/2005 | Turner | |
| 6,919,717 B2* | 7/2005 | Ghassemi | 324/126 |
| 7,095,139 B2* | 8/2006 | Tsutada et al. | 307/129 |
| 7,345,863 B2 | 3/2008 | Fischer | |
| 7,425,778 B2 | 9/2008 | Labuschagne | |
| 7,469,190 B2 | 12/2008 | Bickel | |
| 7,472,026 B2 | 12/2008 | Premerlani | |
| 7,629,786 B2* | 12/2009 | Lee | 323/361 |
| 7,696,648 B2* | 4/2010 | Kinoshita et al. | 307/125 |
| 7,812,615 B2 | 10/2010 | Gajic | |
| 7,982,341 B2* | 7/2011 | Kinoshita et al. | 307/115 |
| 8,008,810 B2* | 8/2011 | Kinoshita et al. | 307/101 |
| 8,217,536 B2* | 7/2012 | Koshizuka et al. | 307/113 |
| 8,289,668 B2 | 10/2012 | Kasztenny | |
| 8,553,379 B2 | 10/2013 | Kasztenny et al. | |
| 8,564,159 B2* | 10/2013 | Udagawa et al. | 307/125 |
| 8,750,008 B2* | 6/2014 | Sugiyama et al. | 363/131 |
| 2001/0012984 A1 | 8/2001 | Adamiak | |
| 2002/0101229 A1 | 8/2002 | Roberts | |
| 2005/0068792 A1* | 3/2005 | Yasumura | 363/21.06 |
| 2007/0070565 A1 | 3/2007 | Benmouyal | |
| 2007/0290670 A1* | 12/2007 | Lee | 323/361 |
| 2009/0059447 A1 | 3/2009 | Gajic | |
| 2009/0091867 A1 | 4/2009 | Guzman-Casillas | |
| 2009/0097173 A1* | 4/2009 | Kinoshita et al. | 361/35 |
| 2010/0002348 A1 | 1/2010 | Donolo | |
| 2010/0039737 A1* | 2/2010 | Koshizuka et al. | 361/36 |
| 2010/0085668 A1* | 4/2010 | Kinoshita et al. | 361/35 |
| 2010/0141235 A1* | 6/2010 | Koshiduka et al. | 323/355 |
| 2011/0080053 A1* | 4/2011 | Urano | 307/104 |
| 2013/0155553 A1* | 6/2013 | Kawasaki et al. | 361/35 |
| 2013/0176021 A1* | 7/2013 | Udagawa et al. | 324/244 |

OTHER PUBLICATIONS

Capacitor Voltage Transformer, available at httP://en.wikipedia.org/wiki/Capacitor_voltage_transformer on Sep. 4, 2010.

Demetrios A. Tziouvaras, Jeff Roberts, and Gabriel Benmouyal, New Multi-Ended Fault Location Design for Two- or Three-Terminal Lines, Nov. 1, 2004.

Gabriel Benmouyal, The Trajectories of Line Current Differential Faults in the Alpha Plane, Sep. 22, 2005.

Debra Carroll, John Dorfner, Tony Lee, Ken Fodero, and Chris Huntly, Resolving Digital Line Current Differential Relay Security and Dependability Problems: A Case History, 29th Annual Western Protective Relay Conference, Spokane Washington, Oct. 22-24, 2002.

Gabriel Benmouyal and Joe B. Mooney, Advanced Sequence Elements for Line Current Differential Protection, Sep. 15, 2006.

GE Industrial Systems, L90 Line Current Differential System, UR Series Instruction Manual, Section 8, Manual P/N:1601-0081-T1(GEK-113488) L90 Revision 5.6x2008, Section 8, Jan. 2008.

PCT/US2010/049162 Patent Cooperation Treaty International Search Report and Written Opinion of the International Searching Authority, Dec. 30, 2010.

Bogdan Kasztenny, Ilia Voloh, Eric A. Udren, Rebirth of Phase Comparison Line Protection Principle, 60th Annual Georgia Tech Protective Relaying Conference, Atlanta, Georgia, May 3-5, 2006.

Min Zhang, Xinzhou Dong, Z Q Bo, B R J Caunce, and A Klimek, Simulation Tests of a Novel Criterion for Neutral Current Differential Protection, International Conference on Power System Technology, Sep. 2006.

Jeff Roberts, Demetrios Tziouvaras, Gabriel Benmouyal, and Hector J. Altuve, The Effect of Multiprinciple Line Protection on Dependability and Security, Feb. 22, 2001.

PCT/US2010/049166 Patent Cooperation Treaty International Search Report and Written Opinion of the International Searching Authority, Dec. 13, 2010.

U.S. Appl. No. 13/416,978, Non-Final Office Action, May 8, 2014.

J. Brunke, Elimination of Transient Inrush Currents When Energizing Unloaded Power Transformers, Ph.D dissertation, ETH Swiss Federal Institute of Technology, Zurich, Switzerland, 1998.

J. H. Brunke and K. J. Frohlich, Elimination of Transformer Inrush Currents by Controlled Switching, Part II, IEEE Transactions on Power Delivery, vol. 16, No. 2, pp. 281-285, Apr. 2002.

J. H. Brunke and K. J. Frohlich, Elimination of Transformer Inrush Currents by Controlled Switching, IEEE Electric Power Systems Research-Selected Topics in Power System Transients, pp. 642-649, May 2006.

A. Mercier, E. Portales, Y. Filion, and A. Salibi, Transformer Control Switching Taking into Account the Core Residual Flux—a Real Case Study, Paper No. 13-201, Cigre 2002 Session, Paris, France.

E. Portales, and Q. Bui-Van, New Control Strategy of Inrush Transient During Transformer Energization at Toulnustouc Hydropower Plant Using a Double-Break 330 kV Circuit Breaker, IPST 2003, New Orleans, USA.

CIGRE WG 13.07, Controlled Switching of Unloaded Power Transformers, ELECTRA, No. 212, pp. 39-47, Feb. 2004.

M. Steurer and K. Frohlich, The impact of inrush currents on the mechanical stress of high voltage power transformer coils, IEEE Transactions on Power Delivery, vol. 17, No. 1, pp. 155-160, Jan. 2002.

F. Ghassemi and P. Gale, Harmonic voltage measurements using CVTs, IEEE Transactions on Power Delivery, vol. 17, No. 4, pp. 915-920, Oct. 2002.

F. Ghassemi and P. Gale, Method to measure CVT transfer function, IEEE Transactions on Power Delivery, vol. 20, No. 1, pp. 443-449, Jan. 2005.

S. Zhao, H. Y. Li, F. Ghassemi, P. Crossley, Impact of power quality sensor technique on power system protection voltage transient measurements, 10th IET International Conference on Developments in Power System Protection, Mar. 2010.

R. Malewski, J. Douville, and L. Lavalee, Measurement of switching transients in 735 kV substations and assessment of their severity for transformer insulation, IEEE Transactions on Power Delivery, vol. 3, No. 4, pp. 1380-1390, Oct. 1988.

Douglas I. Taylor, Single Phase Transformer Inrush Current Reduction Using Pre-Fluxing, A Thesis Presented in Partial Fulfillment of the Requirement for the Degree of Master of Science with a Major in Electrical Engineering in the College of Graduate Studies, University of Idaho, Nov. 13, 2009.

M. J. Heathcote, The J & P Transformer Book, 12th Edition, Elsevier, 1998, pp. 512-513.

S. G. Abdulsalam, W. Xu, A Sequential Phase Energization Method for Transformer Inrush Current Reduction-Transient Performance and Practical Considerations, IEEE Transactions of Power Delivery, vol. 22, No. 1, Jan. 2007, pp. 208-216.

A. Ebner, Determination of Residual Flux for Controlled Transformer Energisation, Power Systems and High Voltage Laboratories Annual Report, 2008, Swiss Federal Institute of Technology, Zurich, Switzerland, pp. 57-61.

V. Molcrette, J.-L. Kotny, J.-P. Swan, J.-F. Brundy, Reduction of Inrush Current in Single-Phase Transformer using Virtual Air Gap Technique, IEEE Transactions on Magnetics, vol. 34, No. 4, pp. 1192-1194, Jul. 1998.

B. Kovan, F. De Leon, D. Czarkowski, Z. Zabar, L. Birenbaum, Mitigation of Inrush Currents in Network Transformers by Reducing the Residual Flux With an Ultra-Low-Frequency Power Source, IEEE Transactions on Power Delivery, vol. 26, No. 3, pp. 1563-1570, Jul. 2011.

ABB, Bushing Potential Device, Type PBA2, Instructions for Installation and Maintenance, Sep. 2003.

(56) References Cited

OTHER PUBLICATIONS

D. Goldsworthy, T. Roseburg, D. Tziouvaras, and J. Pope, Controlled Switching of HVAC Circuit Breakers: Application Examples and Benefits, 34th Annual Western Protective Relay Conference Proceedings, Spokane, WA, Oct. 2007.

T. Liu, H. Siguerdidjane, M. Petit, T. Jung, J.P. Dupraz, Reconstitution of Power transformer's Residual Flux with CVT's Measurement During its De-energization, Sep. 8-10, 2010.

* cited by examiner

SYSTEMS AND METHODS FOR DETERMINING RESIDUAL FLUX IN A POWER TRANSFORMER

TECHNICAL FIELD

This disclosure relates to determining flux in unloaded power transformers. More particularly, this disclosure relates to systems and methods for determining flux in a power transformer using current measurements from a capacitance coupled voltage transformer.

BRIEF DESCRIPTION OF THE DRAWINGS

Non-limiting and non-exhaustive embodiments of the disclosure are described, including various embodiments of the disclosure with reference to the figures, in which.

Figure 1A:
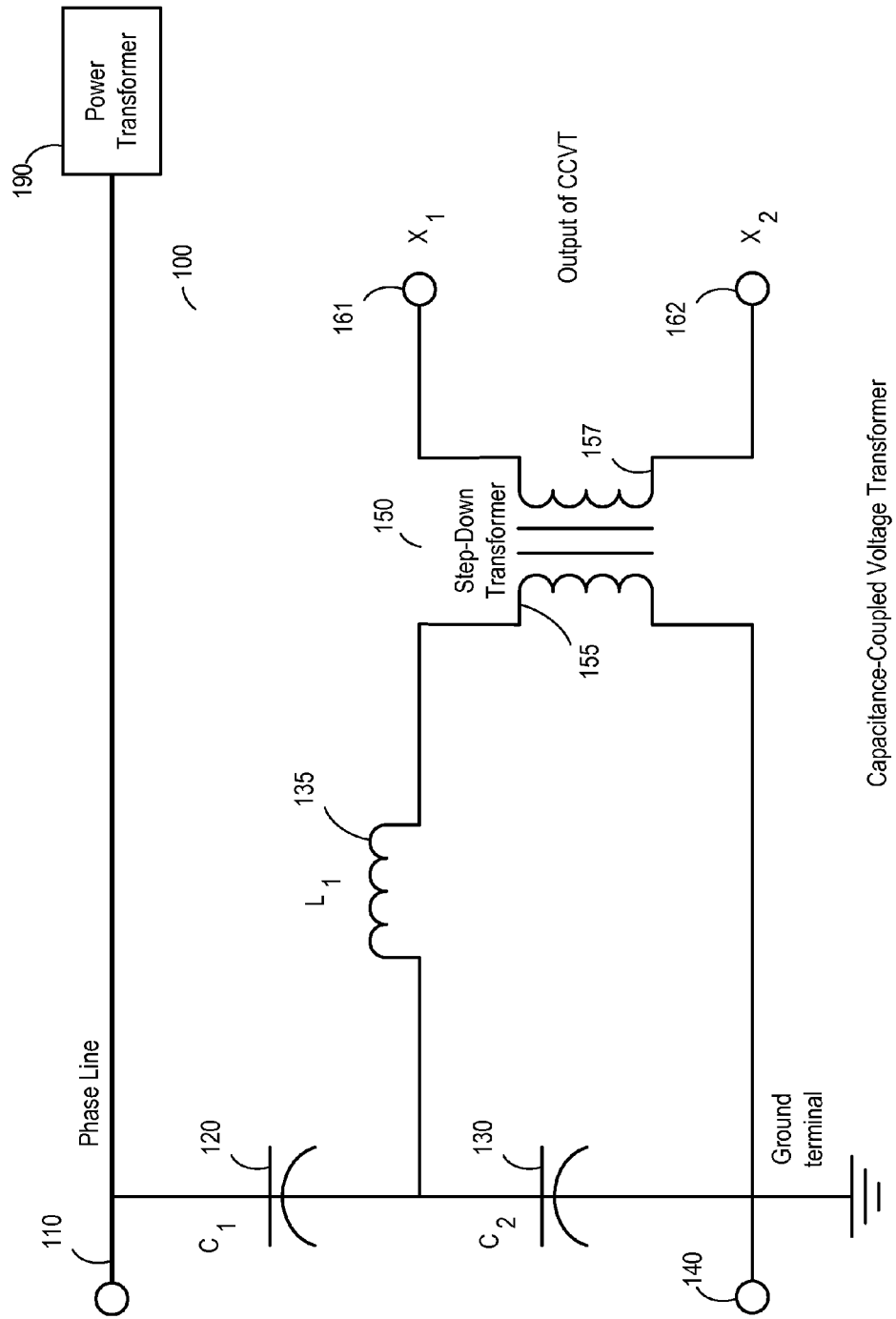
FIG. 1A illustrates a simplified circuit diagram of a capacitance-coupled voltage transformer (CCVT).

In the following description, numerous specific details are provided for a thorough understanding of the various embodiments disclosed herein. The systems and methods disclosed herein can be practiced without one or more of the specific details, or with other methods, components, materials, etc. In addition, in some cases, well-known structures, materials, or operations may not be shown or described in detail in order to avoid obscuring aspects of the disclosure. Furthermore, the described features, structures, or characteristics may be combined in any suitable manner in one or more alternative embodiments.

DETAILED DESCRIPTION

Intelligent electronic devices (IEDs) may be used for monitoring, protecting and/or controlling industrial and utility equipment, such as in electric power delivery systems. IEDs may be configured to obtain measurement information from current sensors and/or voltage sensors, such as current transformers (CTs) and/or voltage transformers (VTs). IEDs may be configured to obtain measurement information from a variety of other sources, such as optical current transducers, Rogowski coils, light sensors, relays, temperature sensors, and similar devices, as well as from measurements, signals, or data provided by other IEDs. IEDs within a power system may be configured to perform metering, control, switching, and protection functions that require a certain level of accuracy. In some embodiments, an IED may be configured to monitor, protect, and/or control the de-energization and/or re-energization of a transformer.

Power transformers may be switched on and off with relative frequency in some configurations, and rarely switched on and off in other situations. For example, a large power transformer used to feed a critical transmission line may only be disconnected as the result of a breaker tripping under fault conditions or during scheduled maintenance. When a power transformer is initially connected to a phase line, the power transformer core is energized with an alternating magnetic flux corresponding to the phase line voltage (voltage at the primary winding of the power transformer). If the power transformer is disconnected from the phase line, the power transformer is de-energized. Transformer de-energization results in a permanent magnetization of the core due to hysteresis of the magnetic material. The remaining transformer core flux is known as the residual flux. The residual flux has a magnitude based on the magnetic properties of the transformer core and a polarity based on the instant the power transformer was de-energized.

Transformer re-energization can create large core flux asymmetries and large inrush currents if the residual flux is not taken into account. In general, the offset of the sinusoidal flux generated by the applied voltage is dependent upon the point on the voltage wave at which the power transformer is re-energized. Non-optimized re-energization can result in peak core flux nearly three times normal peak core flux. This may result in high magnitude inrush currents that are rich in harmonics and have a high dc component. These inrush currents can cause electrical and mechanical stresses in the power transformer and, depending on the prevailing power system conditions, may also cause severe temporary overvoltages (TOVs). In the most severe cases, TOVs may exceed the energy absorption capabilities of surge arresters and expose the equipment in the substation to overvoltages exceeding their voltage ratings. Severe TOVs and high inrush currents may also lead to false operation of protective relays, resulting in a general degradation in power quality.

Typical inrush currents may have peak values reaching several kA. The result is mechanical stress on the transformer windings, interference on secondary circuits from high zero-sequence current, and network disturbances by current harmonics. The large magnetic forces involved with peak currents of thousands of amps may eventually break down weak spots in the transformer insulation, eventually rendering the transformer inoperable. Additionally, large inrush currents may result in partial saturation of other local transformers, referred to as sympathetic inrush, further degrading power quality.

In some embodiments, pre-insertion resistors, surge arresters, and current-limiting reactors may be employed to reduce the magnitude and impact of switching transients. In other embodiments, controlled re-energization can, in many cases, provide an effective means of mitigating flux asymmetries and inrush currents. In order to perform an optimized re-energization of a transformer it is necessary to know the magnitude and polarity of the residual magnetic flux in the transformer core. The power transformer may be optimally re-energized by matching the prospective re-energizing flux with the residual flux in the transformer core.

The residual flux depends on the hysteresis of the transformer magnetic material, the instant of de-energization, and system conditions. The residual flux cannot be measured directly and must be derived from the voltage as measured just before and during the de-energization of the transformer. The residual flux is the final value of the integrated voltage during an interval of integration spanning a few cycles before de-energization and a few cycles during de-energization. Integrating over a relatively few number of cycles may minimize the possibility of introducing errors into the residual flux calculation. In some embodiments, resistive dividers and/or inductive voltage transformers (IVTs) may be used to accurately determine the voltage of a high-voltage phase line connected to the primary winding of the power transformer. While resistive dividers and/or IVTs may be used to accurately calculate the residual flux in a power transformer core, they are expensive and not typically applied in high-voltage systems as interfacing devices between power systems and protective relays (such as IEDs).

Due to cost, size, and other considerations, capacitive-coupled voltage transformers (CCVTs) are commonly employed in high-voltage systems. CCVTs may introduce transient errors that can influence the outcome of the residual flux calculation, making it difficult or impossible to determine the residual flux of a de-energized power transformer core. For example, integrating the output voltage (the secondary windings) of a step-down transformer in a CCVT configuration is unsuitable for calculating the residual flux in the power transformer. This is due, at least in part, to the fact that the CCVT acts as a band-pass filter suppressing low frequency components of the input signal.

According to various embodiments, a CCVT may include a coupling-capacitor voltage divider or a capacitance-bushing voltage divider. In various configurations, the primary winding of the transformer "taps" a point in between a primary capacitive assembly and an auxiliary capacitive assembly. The primary capacitive assembly may couple the primary winding of the transformer to a high voltage phase line, and the auxiliary capacitive assembly may couple the same side of the primary winding to a neutral point (or other reference point).

An IED may be used to measure the current through the primary capacitive assembly using a first current sensor, such as a CT. The IED may also measure the current through the auxiliary capacitive assembly using a second current sensor. In some embodiments, the current through the primary capacitive assembly and the auxiliary capacitive assembly may be directly measured. In some embodiments, the current sensors may be positioned at neutral, ground, or low voltage locations in order to reduce the difficulty in obtaining accurate current measurements.

For example, the current through the auxiliary capacitive assembly may be measured via a current sensor positioned between the auxiliary capacitive assembly and ground. The current through the primary capacitive assembly may be deduced using the current through the auxiliary capacitive assembly and a current measured between the grounded side of the primary winding and ground. Accordingly, the current through the primary and auxiliary capacitive assemblies may be determined using current sensors positioned at zero-voltage points.

The IED may then calculate the voltage on the phase line using the current through the primary capacitive assembly, the current through the auxiliary capacitive assembly, and the capacitances of the primary and auxiliary capacitive assemblies. The IED may then integrate the calculated voltage on the phase line in order to determine the magnetic flux within a core of a power transformer connected to the phase line.

According to some embodiments, the IED may receive a signal, or otherwise detect, that the power transformer has been de-energized. The IED may then determine an appropriate interval of integration based on the de-energizing moment in order to determine the residual flux in the de-energized power transformer. During re-energization, the IED may communicate with one or more additional IEDs, breakers, relays, and/or other power system components in order to ensure that the re-energizing voltage applied to the power transformer is matched with the residual magnetic flux within the transformer. As previously described, by matching the re-energizing voltage with the residual magnetic flux, asymmetric fluxes and large inrush currents can be minimized or eliminated.

The phrases "connected to" and "in communication with" refer to any form of interaction between two or more components, including mechanical, electrical, magnetic, and electromagnetic interaction. Two components may be connected to each other, even though they are not in direct contact with each other, and even though there may be intermediary devices between the two components.

As used herein, the term IED may refer to any microprocessor-based device that monitors, controls, automates, and/or protects monitored equipment within a system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, motor drives, and the like. IEDs may be connected to a network, and communication on the network may be facilitated by networking devices including, but not limited to, multiplexers, routers, hubs, gateways, firewalls, and switches. Furthermore, networking and communication devices may be incorporated in an IED or be in communication with an IED. The term IED may be used interchangeably to describe an individual IED or a system comprising multiple IEDs.

Aspects of certain embodiments described herein may be implemented as software modules or components. As used herein, a software module or component may include any type of computer instruction or computer executable code located within or on a computer-readable storage medium. A software module may, for instance, comprise one or more physical or logical blocks of computer instructions, which may be organized as a routine, program, object, component, data structure, etc., that performs one or more tasks or implements particular abstract data types.

The embodiments of the disclosure will be best understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments. In other instances, well-known structures, materials, or operations are not shown or described in detail to avoid obscuring aspects of this disclosure. In addition, the steps of a method do not necessarily need to be executed in any specific order, or even sequentially, nor need the steps be executed only once, unless otherwise specified.

FIG. 1A illustrates a simplified circuit diagram of a capacitance coupled voltage transformer (CCVT) 100 configured to monitor the voltage on a phase line 110 connected to a power transformer 190. As illustrated, simplified CCVT 100 includes a step-down step-down transformer 150 including a primary winding 155 and a secondary (output) winding 157. The output voltage of CCVT 100 is measured across terminals X1 161 and X2 162 on secondary winding 157. In various embodiments, step-down transformer 150 may have a voltage potential across primary winding 155 that is higher than the voltage potential across secondary winding 157. As illustrated, step-down transformer 150 includes a primary capacitive assembly (C1) 120 and auxiliary capacitive assembly (C2) 130. Additionally, an inductor (L1) 135 may be configured to tune CCVT 100 and improve accuracy.

Primary winding 155 may be said to "tap" the junction of C1 120 and C2 130. C1 120 may couple primary winding 155 to phase line 110. C2 130 may couple the high-voltage side of primary winding 155 to ground 140. Ground 140 may be a physical ground, a neutral point, or a neutral phase line. CCVT 100 may be used to step down high-voltage phase line 110 to a lower voltage across X1 161 and X2 162. For example, phase line 110 may have a potential of 230 KV and the outputs X1 161 and X2 162 of CCVT 100 may have a potential of 115 V. CCVT 100, including capacitive assemblies C1 120 and C2 130, may be smaller and/or less costly to manufacture than an equivalent inductive transformer. Accordingly, CCVT 100 may be used to measure the voltage on phase line 110 that feeds a primary winding of power transformer 190.

Figure 1B:
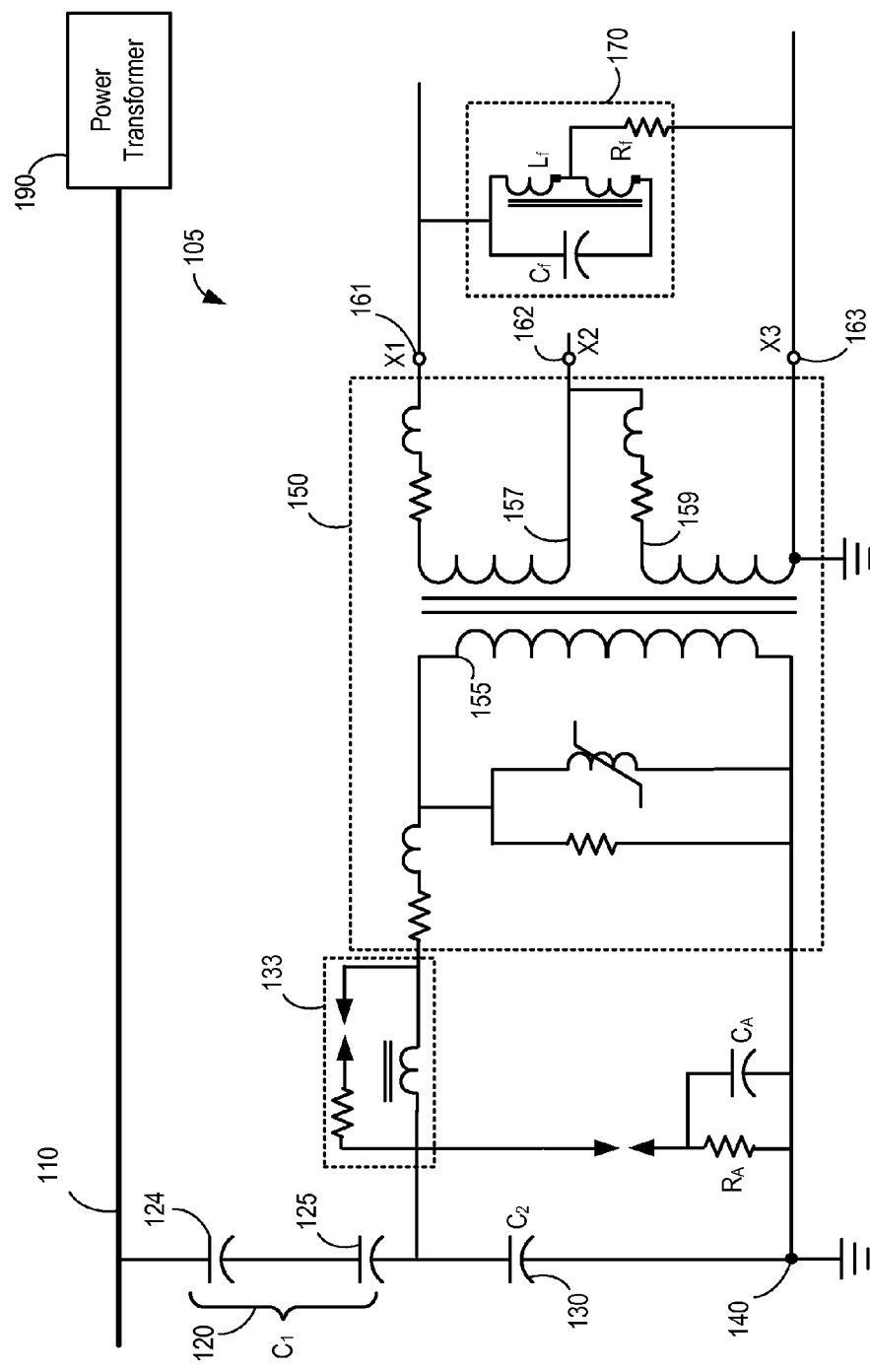
FIG. 1B illustrates a circuit diagram of a CCVT, including various tuning and protection circuits.

As previously stated, FIG. 1A illustrates a simplified diagram of a CCVT 100. The present systems and methods are applicable to both passive CCVTs and active CCVTs. FIG. 1B illustrates a circuit diagram including the main components of an active single-phase CCVT 105, including various tuning and protection circuits. CCVT 105 includes primary capacitive assembly 120 (comprising capacitor 124 and capacitor 125) and auxiliary capacitive assembly 130. A compensating reactor 133 may include inductive, capacitive, and/or resistive elements. A ferroresonant suppression circuit (FSC) 170 may be connected to output terminals X1 161 and X3 163 across secondary windings 157 and 159. FSC 170 may reduce or eliminate ferroresonant conditions within the CCVT 105 that might otherwise cause damaging overvoltages and/or overcurrents.

Primary capacitive assembly 120 may couple the high-voltage side of primary winding 155 to a high-voltage phase line 110. Auxiliary capacitive assembly 130 may couple the high voltage side of primary winding 155 to a neutral point 140, such as ground. Accordingly, primary capacitive assembly 120 and auxiliary capacitive assembly 130 may be part of a coupling-capacitor voltage divider or a capacitance-bushing voltage divider with the high-voltage side of the primary winding coupled to the "tap" of such devices. Step-down transformer 150 may step down the voltage via one or more secondary windings 157 and 159. Various desired output voltages may be achieved using any number of secondary windings and associated terminals, such as terminals X1 161, X2 162, and X3 163.

Figure 2:
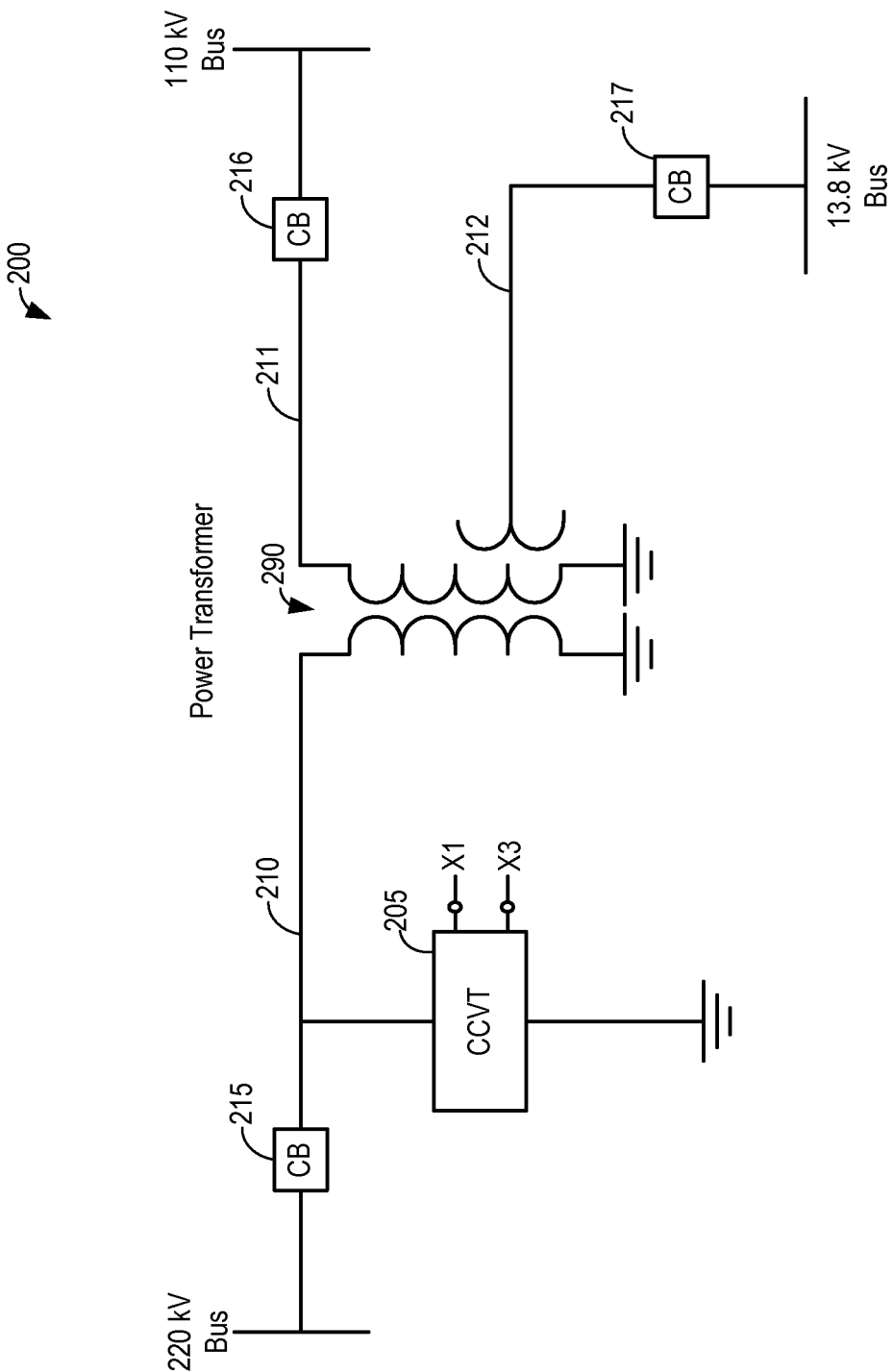
FIG. 2 illustrates a circuit diagram of a CCVT configured to measure the voltage of a phase line connected to a power transformer.

The interaction of the various capacitive and reactive elements in CCVT 105 results in transient errors in the secondary voltage output during switching and faults. As previously described, the poor transient response of CCVTs makes it difficult or impossible to accurately determine the magnetic flux within the core of power transformer 190 when it is de-energized. For example, the voltage measured at outputs X1 161 and X3 163 is unsuitable to determine the residual flux in the core of power transformer 190 after it is de-energized FIG. 2 illustrates a circuit diagram of a CCVT 205 configured to measure the voltage of a phase line 210 connected to a power transformer 290. As illustrated, phase line 210 may be connected to a high voltage (e.g., 220 kV) bus via a circuit breaker 215. Power transformer 290 may be configured to distribute the high-voltage power on phase line 210 to secondary distribution lines 211 and 212. As illustrated, distribution line 211 may be connected to a 110 kV bus via circuit breaker 216, and distribution line 212 may be connected to a 13.8 kV bus via circuit breaker 217.

As previously described, if power transformer 290 is de-energized by opening breaker 215, the core of power transformer 290 may be left with a residual flux due to the hysteresis of the magnetic material. If the residual flux in the core of power transformer 290 is not accounted for during re-energization, the re-energization may create large core flux asymmetries and large inrush currents. Such a non-optimized re-energization can result in peak core flux nearly three times normal peak core flux. Severe TOVs and high inrush currents may also lead to false operation of protective relays, resulting in a general degradation in power quality.

As previously described, one method of determining the residual flux within the core of power transformer 290 is to integrate the voltage on phase line 210 just before and during de-energization. Since the voltage on phase line 210 is so high, it is difficult and/or expensive to measure the voltage of phase line 210 using resistive dividers and/or IVTs. It may be beneficial to measure the voltage of phase line 210 using CCVT 205. However, as previously described, due to the transient nature of CCVTs, the output voltage (X1 and X3) of CCVT 205 may be unsuitable for determining the residual flux within the core of power transformer 290. Specifically, integrating the output voltage (the secondary windings) of the step-down transformer in CCVT 205 is unsuitable for calculating the residual flux in the core of power transformer 290. This is due, at least in part, to the fact that CCVT 205 acts as a band-pass filter suppressing low frequency components of the input signal.

Figure 3:
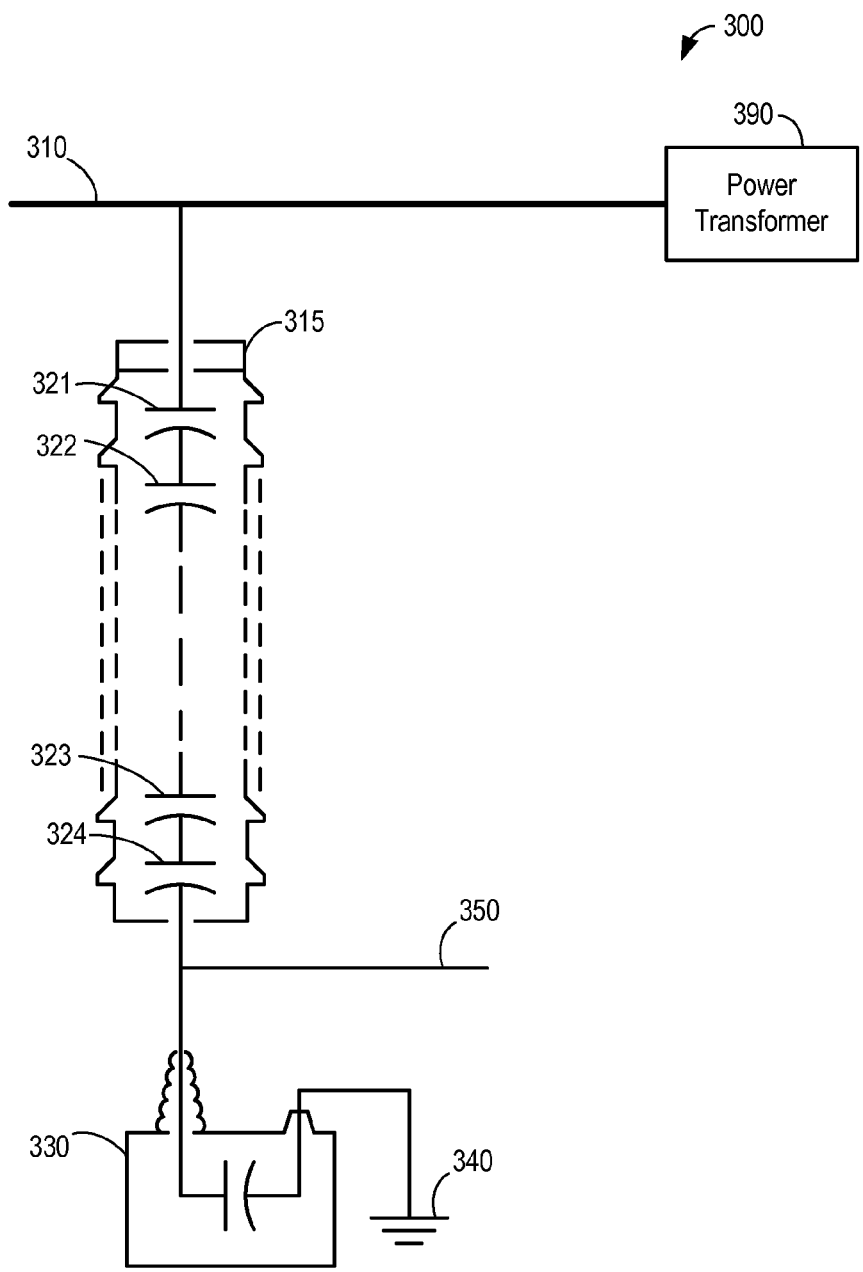
FIG. 3 illustrates an embodiment of a coupling-capacitor voltage divider that may be used in conjunction with a transformer to form a CCVT.

FIG. 3 illustrates an embodiment of a coupling-capacitor voltage divider 300 that may be used in conjunction with a step-down transformer to form a CCVT. A primary capacitive assembly, comprising capacitive elements 321, 322, 323, and 324 may couple a high-voltage phase line to a "tap" 350. Since the voltage on both sides of capacitive elements 321, 322, 323, and 324 (forming the primary capacitive assembly) is relatively high, primary capacitive elements 321, 322, 323, and 324 may be housed within an insulating bushing 315. "Tap" 350 may be coupled to a neutral point 340 via an auxiliary capacitive assembly 330. Accordingly, high-voltage phase line 310 may be coupled to neutral via primary capacitive elements 321, 322, 323, and 324 and auxiliary capacitive assembly 330. The primary winding of a step-down transformer may be connected to "tap" 350 positioned between primary capacitive elements 321, 322, 323, and 324 and auxiliary capacitive assembly 330.

Figure 4:
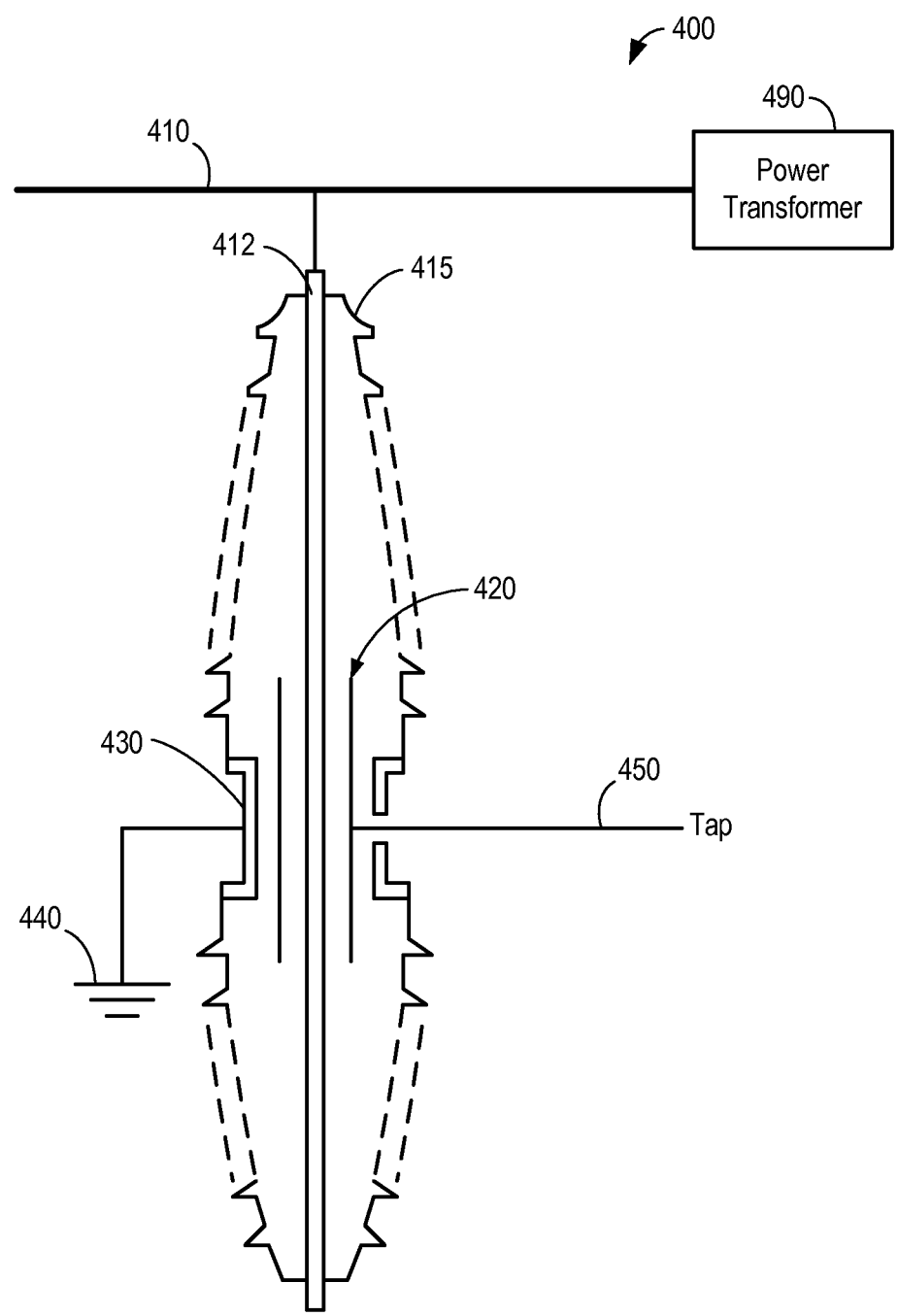
FIG. 4 illustrates an embodiment of a capacitance-bushing voltage divider that may be used in conjunction with a transformer to form a bushing potential device.

FIG. 4 illustrates an embodiment of a capacitance-bushing voltage divider 400 that may be used in conjunction with a step-down transformer to form a bushing potential device. Capacitance-bushing voltage divider 400 may include a center conductor 412 attached to a high-voltage phase line 410. An insulating bushing 415 may surround center conductor 412. Insulating bushing 415 may include one or more layers of capacitive and dielectric materials. A first capacitive layer 420 may be used to couple a tap 450 to high-voltage phase line 410. Accordingly, center conductor 412 and first capacitive layer 420 may form a primary capacitive assembly that couples tap 450 to phase line 410. A second capacitive layer 430 in conjunction with first capacitive layer 420 and center conductor 412 may form an auxiliary capacitive assembly coupling tap 450 and phase line 410 to neutral point 440. The primary winding of a step-down transformer may be connected to tap 450 in order to form a bushing potential device. Accordingly, a CCVT, as used herein, may comprise a step-down transformer connected to a phase line via a bushing capacitance-bushing voltage divider 400, such that first capacitive layer 420 serves as a primary capacitive assembly and second capacitive layer 430 serves as an auxiliary capacitive assembly.

Figure 5:
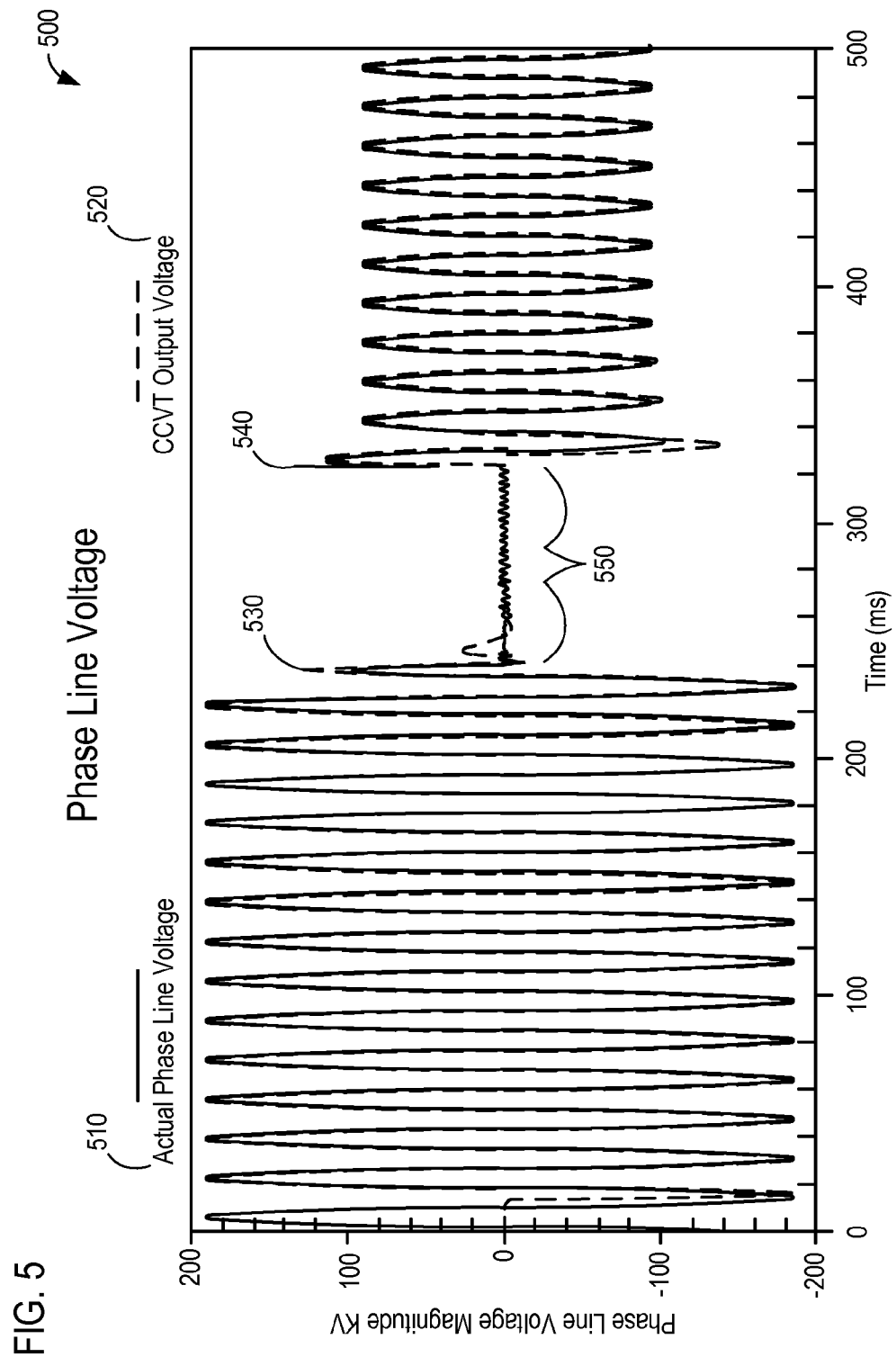
FIG. 5 illustrates an oscillographic comparison of the actual phase line voltage and the phase line voltage as derived from the output of a CCVT.
Figure 6:
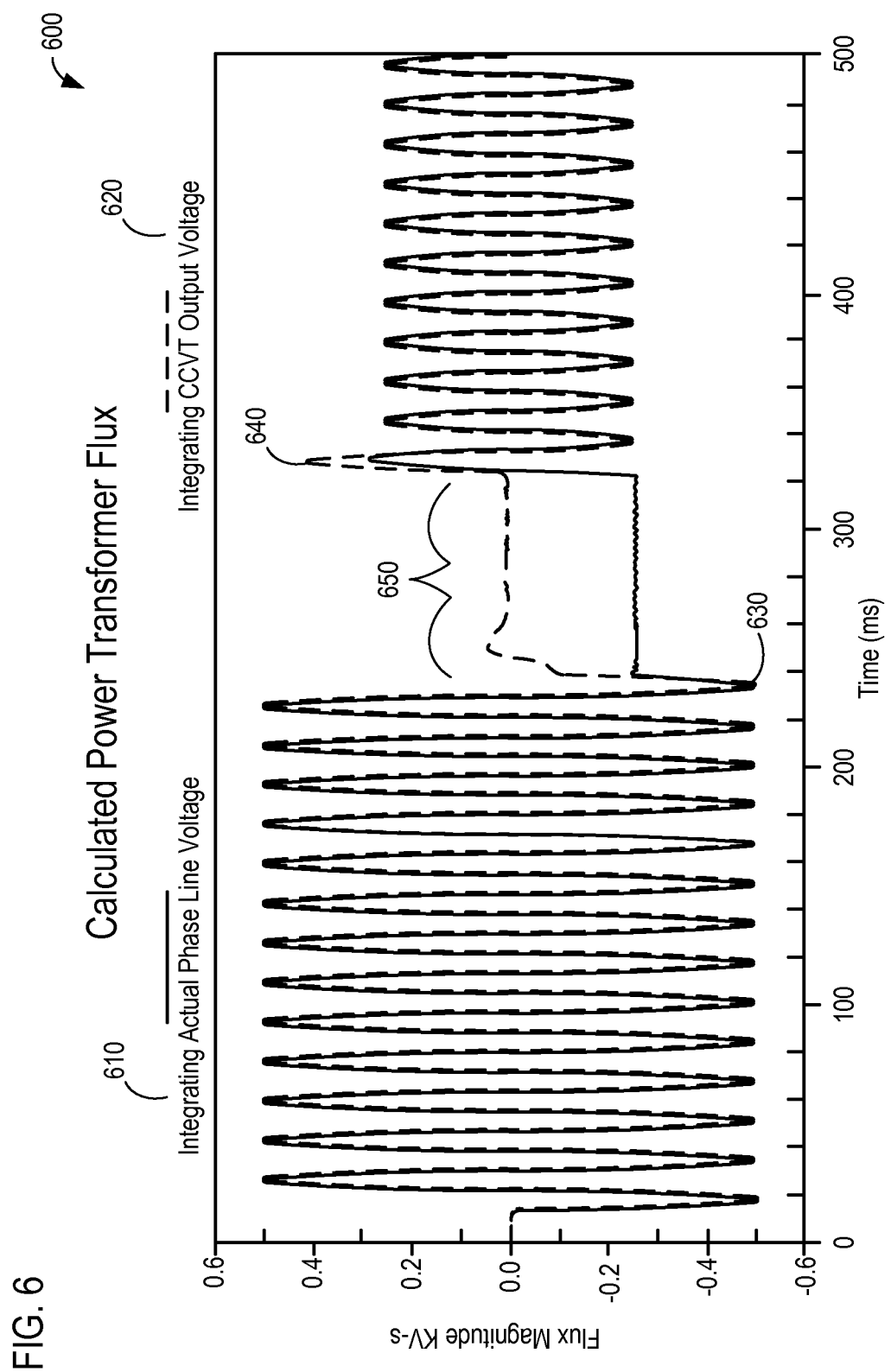
FIG. 6 illustrates an oscillographic comparison of the power transformer flux calculated by integrating the actual phase line voltage and the phase line voltage derived from the output of a CCVT.

As described above, while CCVTs may be smaller and/or cheaper than an equivalent inductive transformer, the poor transient response of CCVTs makes it difficult or impossible to accurately determine the magnetic flux within the core of a de-energized power transformer. Specifically, the voltage measured at the output of the CCVT is unsuitable to determine the residual flux in the core of a de-energized transformer. FIGS. 5 and 6 illustrate various oscillographic reports that demonstrate the limitations of CCVTs. Specifically, that while the output voltage of a CCVT corresponds to the actual voltage across the primary winding of a power transformer, the output voltage of the CCVT cannot be used to accurately determine the magnetic flux in the core of the power transformer. The oscillographic reports of FIGS. 5 and 6 correspond to a CCVT, such as CCVT 105 illustrated in FIG. 1B, which includes primary and auxiliary capacitive assemblies, such as those shown in FIGS. 3 and 4.

FIG. 5 illustrates an oscillographic comparison 500 of the actual phase-B line voltage 510 and the phase-B line voltage calculated using the voltage measured at the output of a CCVT (calculated phase line voltage 520). At a time zero (along the X-axis) the actual phase-B line voltage 510 alternates between approximately −200 kV and 200 kV (along the Y-axis). At approximately 240 ms, at 530, the power transformer (such as power transformer 290 in FIG. 2) is de-energized and the actual phase-B line voltage 510 drops to approximately zero for duration 550. At approximately 320 ms, at 540, phase-A of the power transformer is re-energized and the actual phase-B line voltage 510 alternates between approximately −100 KV and 100 KV (phase-B voltage, after the transformer is re-energized, is approximately one-half of the phase-B voltage prior to transformer de-energization because only phase-A of the transformer was re-energized causing induced phase-B voltage from the transformer delta-connected tertiary windings).

The phase line voltage may be calculated using the voltage measured at an output (secondary winding) of the CCVT. As illustrated in FIG. 5, the calculated phase line voltage 520 based on the measured voltage at the output of the CCVT is relatively accurate, though imperfect to the poor transient response of CCVTs.

The flux in a core of the power transformer may be determined by integrating the voltage at the primary winding of the power transformer. FIG. 6 illustrates an oscillographic comparison 600 of the actual flux 610 in the core of a power transformer (such as power transformer 290 in FIG. 2) and the derived flux 620 calculated by integrating the calculated phase line voltage 520 based on the measured output of the CCVT. As illustrated, when the power transformer is de-energized, at 630, the actual residual flux remains at about 0.3 kV-s, while the derived flux 620 calculated by integrating the calculated phase line voltage 620 indicates that there is no residual flux.

Accordingly, FIGS. 5 and 6 illustrate that while the voltage measured at the output of a CCVT does correspond to the actual voltage across the primary winding of the power transformer (see FIG. 5), integrating the voltage derived from the output of a CCVT cannot be used to determine the actual magnetic flux in the core of the power transformer during de-energization and re-energization events. More particularly, the voltage measured at the output of a CCVT cannot be used to accurately determine the residual flux in a de-energized power transformer connected to the same phase line as the CCVT.

FIGS. 7-10 illustrate various oscillographic reports that demonstrate the effects of a non-optimized re-energization of a power transformer core as compared to an optimized re-energization of a power transformer core. The oscillographic reports of FIGS. 7-10 correspond to one or more power transformers, such as power transformer 290 illustrated in FIG. 2.

Figure 7:
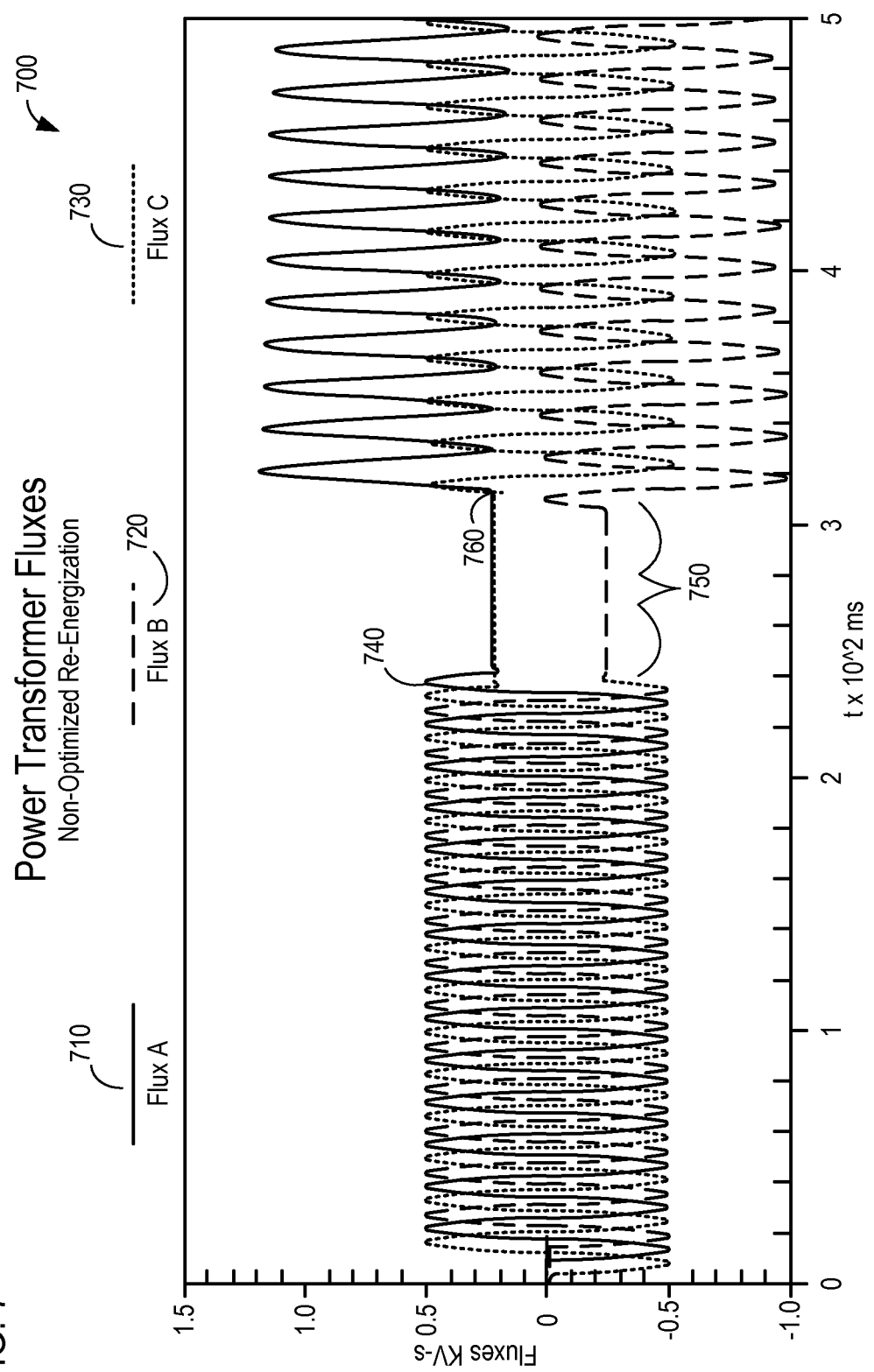
FIG. 7 illustrates an oscillographic representation of the fluxes during non-optimal re-energization of a three-phase power transformer.
Figure 8:
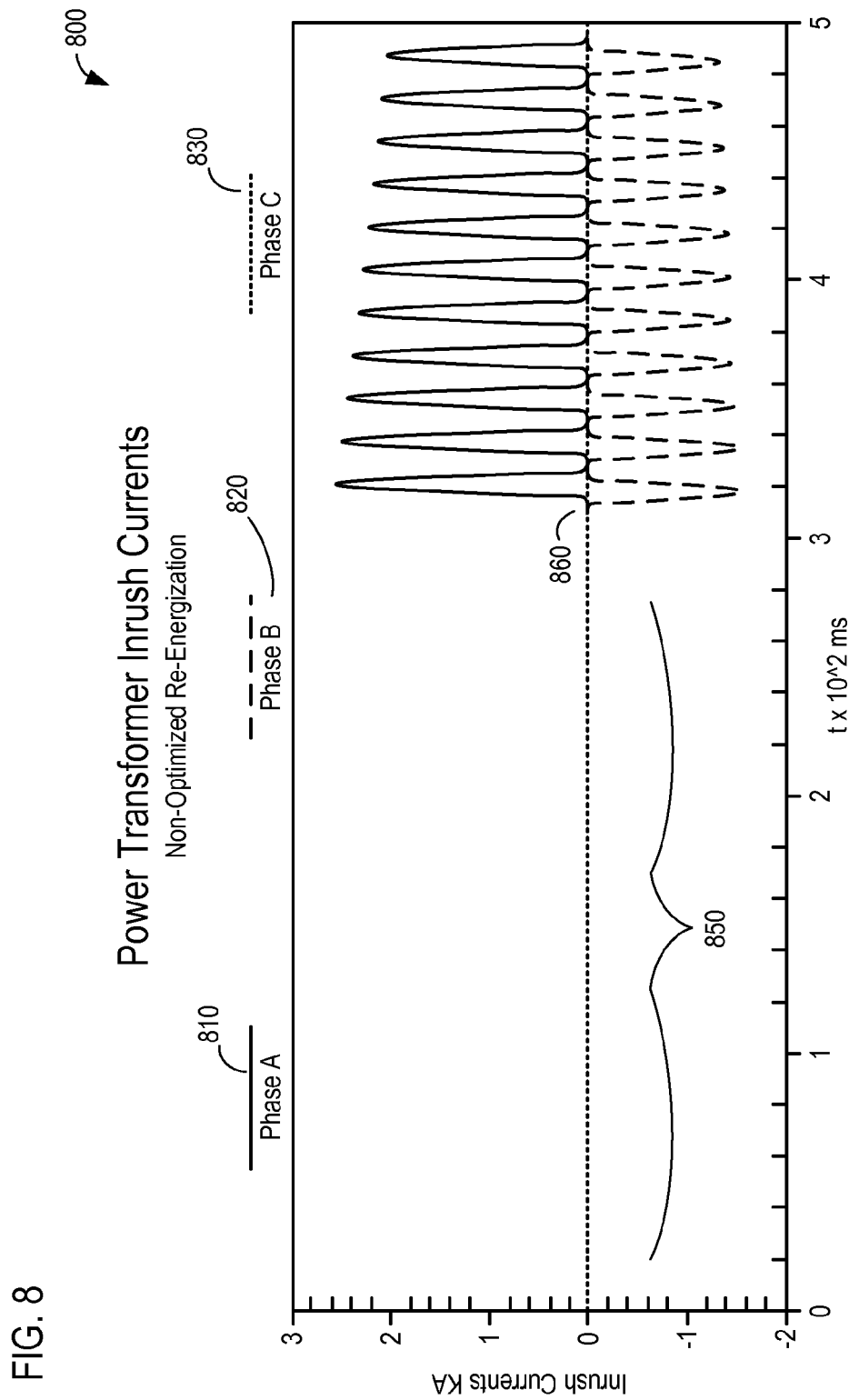
FIG. 8 illustrates an oscillographic representation of the inrush currents during the non-optimal re-energization of the three-phase power transformer.

FIG. 7 illustrates an oscillographic representation 700 of the fluxes during non-optimal re-energization of a three-phase power transformer. As illustrated in FIG. 7, prior to a de-energization event, at 740, the fluxes in the power transformer core of each of the three phases 710, 720, and 730 have an amplitude of approximately 0.5 KV-s. While de-energized, at 750, each of the three phases 710, 720, and 730 results in non-zero residual flux. A non-optimized re-energizing event, at 760, causes the flux associated with each of the three phases 710, 720, and 730 to exceed normal parameters, and potentially saturate the corresponding power transformer cores. As illustrated in FIG. 8, abnormally high flux levels created during the non-optimized re-energization result in high inrush currents.

FIG. 8 illustrates an oscillographic representation 800 of the inrush currents during the non-optimal re-energization of the three-phase power transformer. Each of the three phases 810, 820, and 830 has a current magnitude of 0 while the transformer is de-energized, at 850. At 860, the power transformer is re-energized without consideration of the residual fluxes (see 750 in FIG. 7). The non-optimized re-energization creates inrush currents above 2000 amps on Phase A 810 and above 1500 amps on phase B 820. High inrush currents, such as those illustrated in FIG. 8, may cause severe TOVs that may exceed the energy absorption capabilities of surge arresters and expose the equipment in the substation to overvoltage's exceeding their ratings. TOVs and high inrush currents may also lead to the false operation of protective relay, resulting in a general degradation in power quality.

Figure 9:
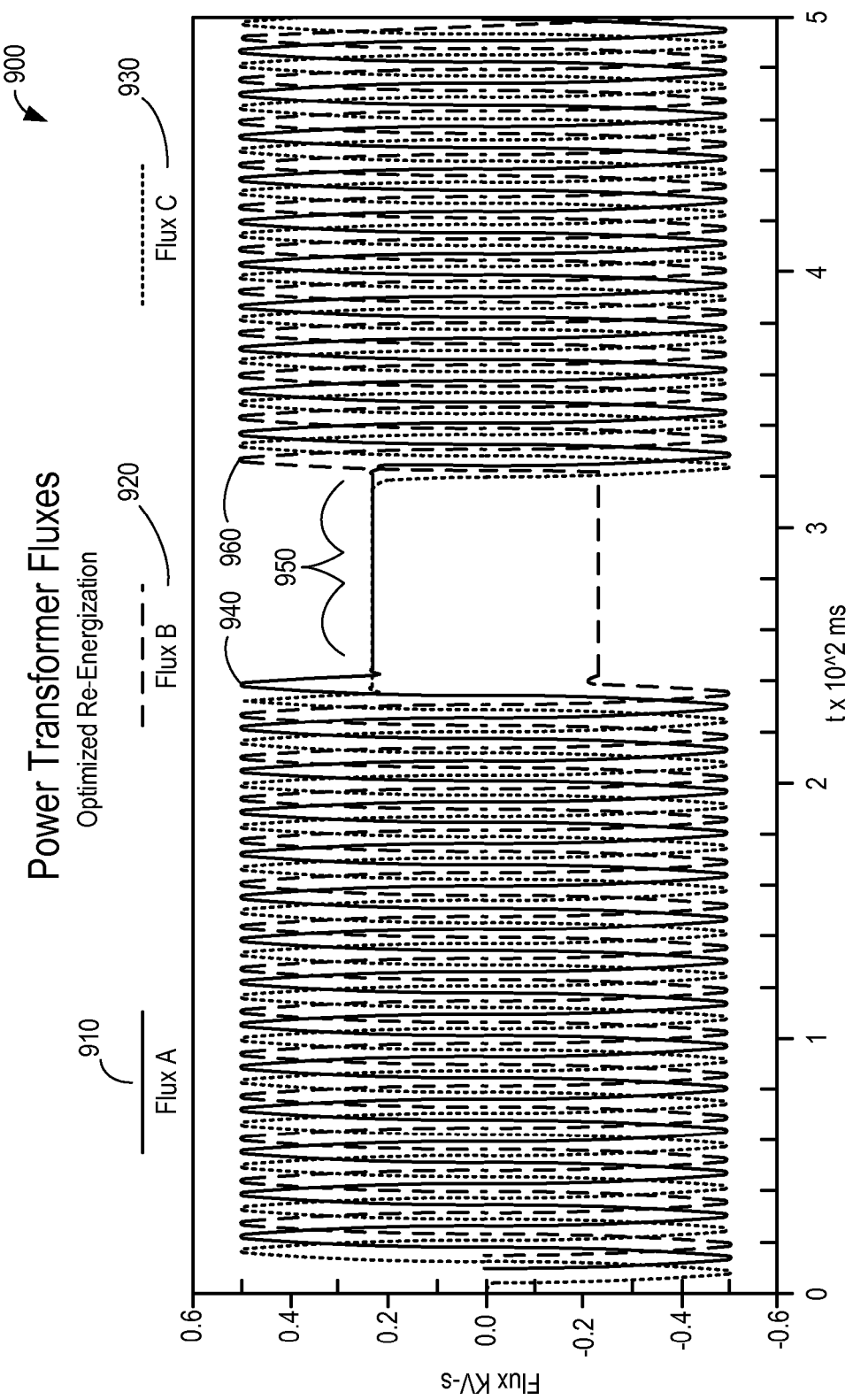
FIG. 9 illustrates an oscillographic representation of the fluxes during an optimal re-energization of a three-phase power transformer.

FIG. 9 illustrates an oscillographic representation 900 of the flux during an optimal re-energization of a three-phase power transformer. Similar to FIG. 7, each of the three phases 910, 920, and 930 in the three-phase power system creates magnetic fluxes in the power transformer core of approximately 0.5 kV-s prior to a de-energizing event, at 940. As illustrated, while the power transformer is de-energized, at 950, the power transformer core(s) of each of the three phases 910, 920, and 930 may contain a residual flux. At 960, the power transformer is re-energized with consideration for the magnitude and polarity of the residual flux associated with each of the three phases 910, 920, and 930. In contrast to FIG. 7, the re-energizing fluxes in the power transformer core following the optimized re-energizing event do not exceed normal parameters.

Figure 10:
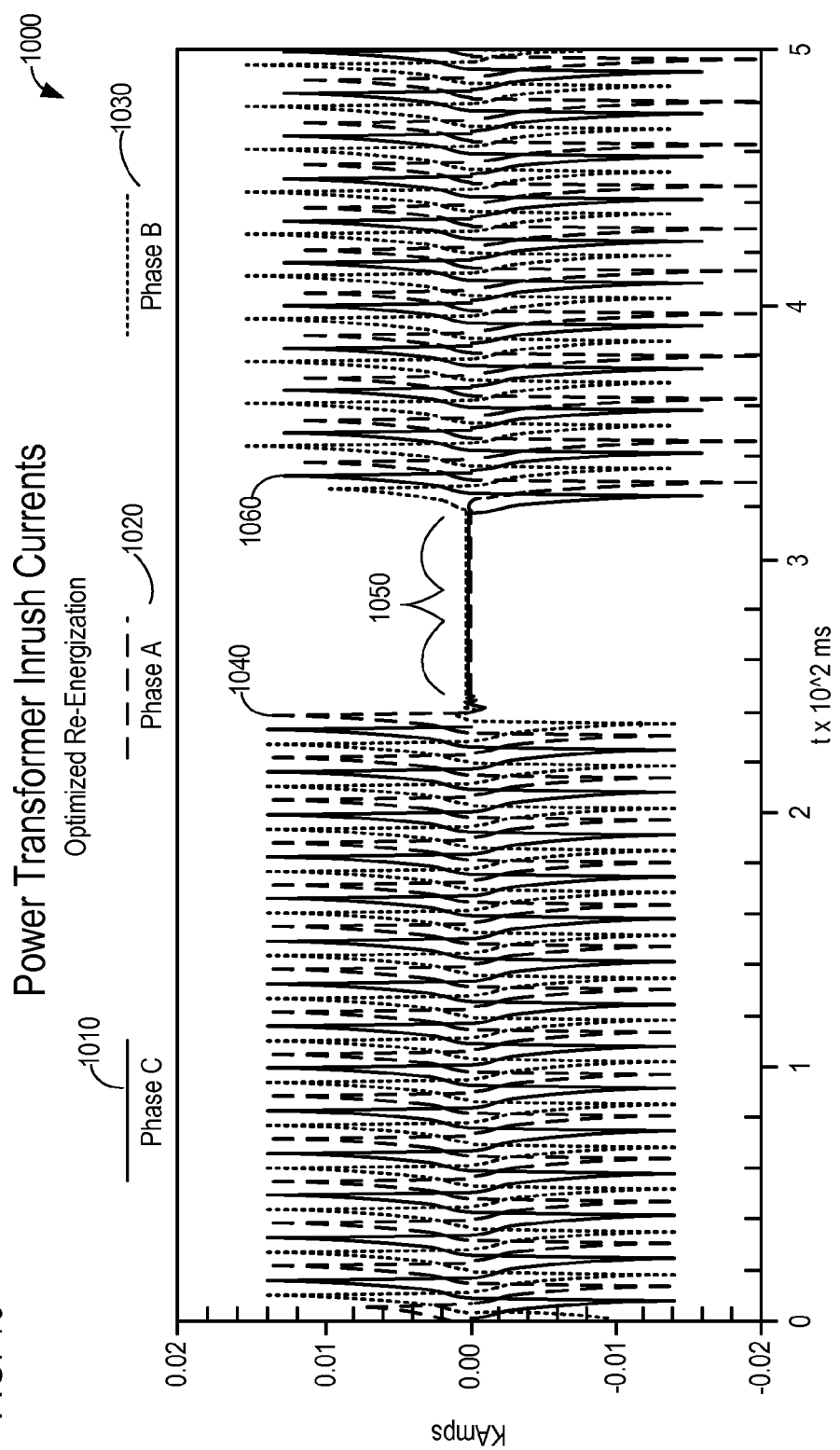
FIG. 10 illustrates an oscillographic representation of the inrush currents during the optimal re-energization of the three-phase power transformer.

Accordingly, the inrush currents seen in FIG. 9 under non-optimized re-energization are avoided, as can be seen in FIG. 10. FIG. 10 illustrates an oscillographic representation 1000 of the inrush currents during the optimal re-energization of the three-phase power transformer. Current flow is abruptly cut off to each of the three phases 1010, 1020, and 1030 following a de-energizing event, at 1040. Each of the three phases 1010, 1020, and 1030 maintains a current magnitude of 0 while the power transformer is de-energized, at 1050. At 1060, the power transformer is re-energized with consideration of the residual fluxes (see 950 in FIG. 9). The optimized re-energization substantially eliminates high inrush currents. In contrast with the non-optimized re-energization illustrated in FIG. 8, FIG. 10 illustrates current magnitudes following the optimized re-energization event, at 1060, that do not even approach 20 amps.

Accordingly, FIGS. 7-10 contrast and compare the flux and current magnitude differences between non-optimized and optimized re-energization of power transformers. High inrush currents associated with non-optimized re-energization events can be avoided if the re-energizing currents take the residual fluxes into account. Accordingly, it is desirable to determine the residual flux in a power transformer prior to re-energizing. As illustrated in FIG. 6 and described above, the output voltage of a CCVT is unsuitable to accurately determine the residual flux in a de-energized power transformer because of the poor transient response of CCVTs. Additionally, it is difficult to directly measure the phase line voltage on the primary winding of a power transformer in a high-voltage system, due to the cost and size of the necessary equipment. The presently described systems and methods provide a way to more efficiently determine the flux in the core of a power transformer using current sensors strategically placed in a CCVT configured to monitor the voltage of a phase line connected to the primary winding of a power transformer.

Figure 11:
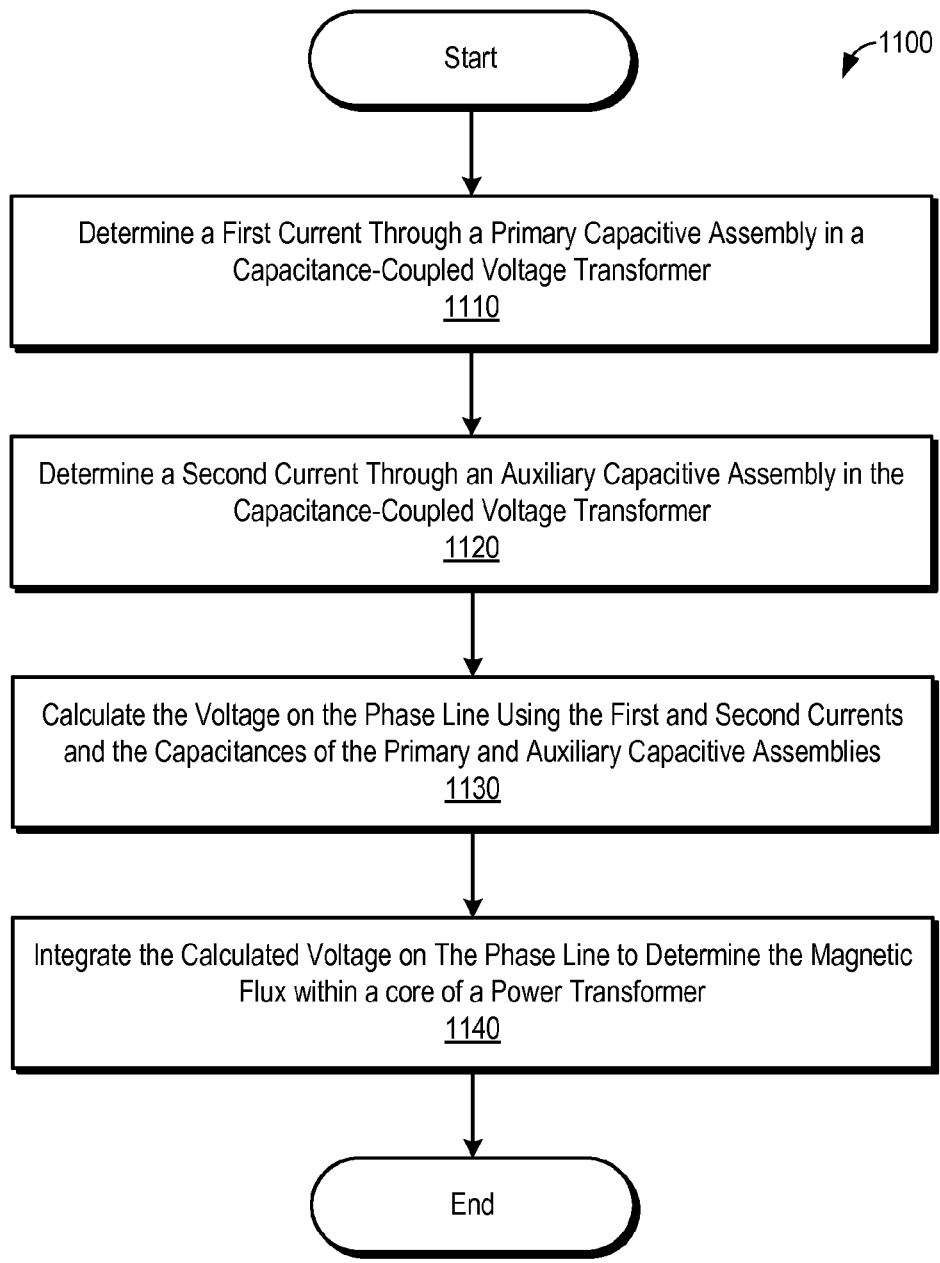
FIG. 11 illustrates a method for accurately determining the magnetic flux within the core of a power transformer using a voltage derived from a CCVT.

FIG. 11 illustrates a method 1100 for accurately determining the magnetic flux within the core of a power transformer for a single phase. The method 1100 could be repeated for each phase of a multi-phase power system utilizing independent transformers for each phase. Similarly, the method 1100 could be adapted to accommodate a multi-phase power system in which one or more cores of a power transformer are shared or influenced by two or more phase lines in the multi-phase power system.

With regards to one phase in a three-phase power system, an IED may determine a first current through a primary capacitive assembly in a CCVT, at 1110. The IED may determine a second current through an auxiliary capacitive assembly in the CCVT, at 1120. The IED may then calculate the voltage on the phase line using the first and second currents, the capacitance of the primary capacitive assembly, and the capacitance of the auxiliary capacitive assembly, at 1130. The IED may then integrate the calculated voltage on the phase line to determine the magnetic flux within the core of a power transformer connected to the same phase line at any given time or during a predetermined period of time, at 1140.

According to various embodiments, a local IED may utilize distributed or cloud computing developments to reduce the data storage or processing demands. For example, the local IED may receive signals from current sensors associated with the primary and auxiliary capacitive assemblies and transmit the current signals to a remote IED configured to store and/or process the data. The local IED (or other IED configured to monitor, protect, and/or control aspects of the power system associated with the transformer) may then receive instruction from the remote IED with regards to breaker switching, or other related events, in order to ensure that a transformer is re-energized optimally.

In some embodiments, the current through the primary capacitive assembly and the auxiliary capacitive assembly may be directly measured. In some embodiments, current sensors may be positioned at neutral, ground, or low voltage locations in order to reduce the difficulty in obtaining accurate current measurements.

For example, the current through the auxiliary capacitive assembly may be measured via a current sensor positioned between the auxiliary capacitive assembly and ground. The current through the primary capacitive assembly may be deduced using the current through the auxiliary capacitive assembly and a current measured between the grounded side of the primary winding and ground. Accordingly, the current through the primary and auxiliary capacitive assemblies may be determined using current sensors positioned at zero-voltage points.

Figure 12A:
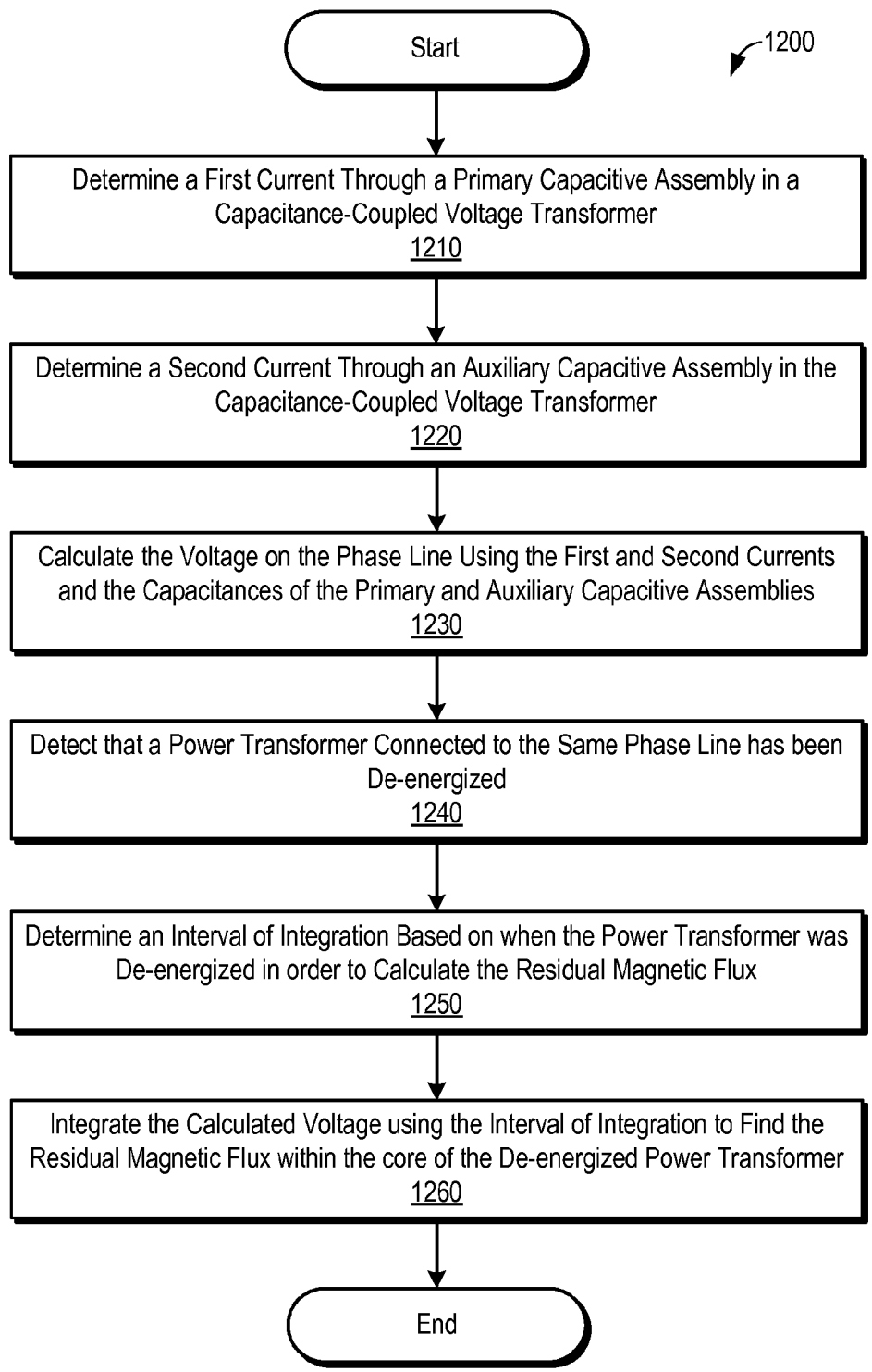
FIG. 12A illustrates a related method for accurately determining the residual magnetic flux within the core of a power transformer using a voltage derived from a CCVT.

FIG. 12A illustrates a related method 1200 for accurately determining the residual magnetic flux within the core of a power transformer using current measurements from a CCVT. The method of FIG. 12A is described as being performed by an IED, however, various machines, apparatuses, and/or persons could alternatively perform method 1200. An IED determines the current through the primary capacitive assembly in the CCVT, at 1210. The IED determines the current through the auxiliary capacitive assembly in the CCVT, at 1220. The IED calculates the voltage on the phase line using the first and second currents and the capacitances of the primary and auxiliary capacitive assemblies, at 1230. The IED may then detect, or receive a signal indicating, that a power transformer connected to the same phase line as the CCVT has been de-energized, at 1240. The IED may determine an interval of integration based on when the power transformer was de-energized in order to calculate the residual magnetic flux within the core of the power transformer, at 1250. The IED may then integrate the calculated voltage using the interval of integration to find the residual magnetic flux within the core of the de-energized power transformer, at 1260.

Again, the current through the primary capacitive assembly and the auxiliary capacitive assembly may be directly measured. Alternatively, current sensors may be positioned at neutral, ground, or low voltage locations in order to reduce the difficulty in obtaining accurate current measurements. Accordingly, the current through the auxiliary capacitive assembly may be measured via a current sensor positioned between the auxiliary capacitive assembly and ground. The current through the primary capacitive assembly may be deduced using the current through the auxiliary capacitive assembly and a current measured between the grounded side of the primary winding and ground.

Figure 12B:
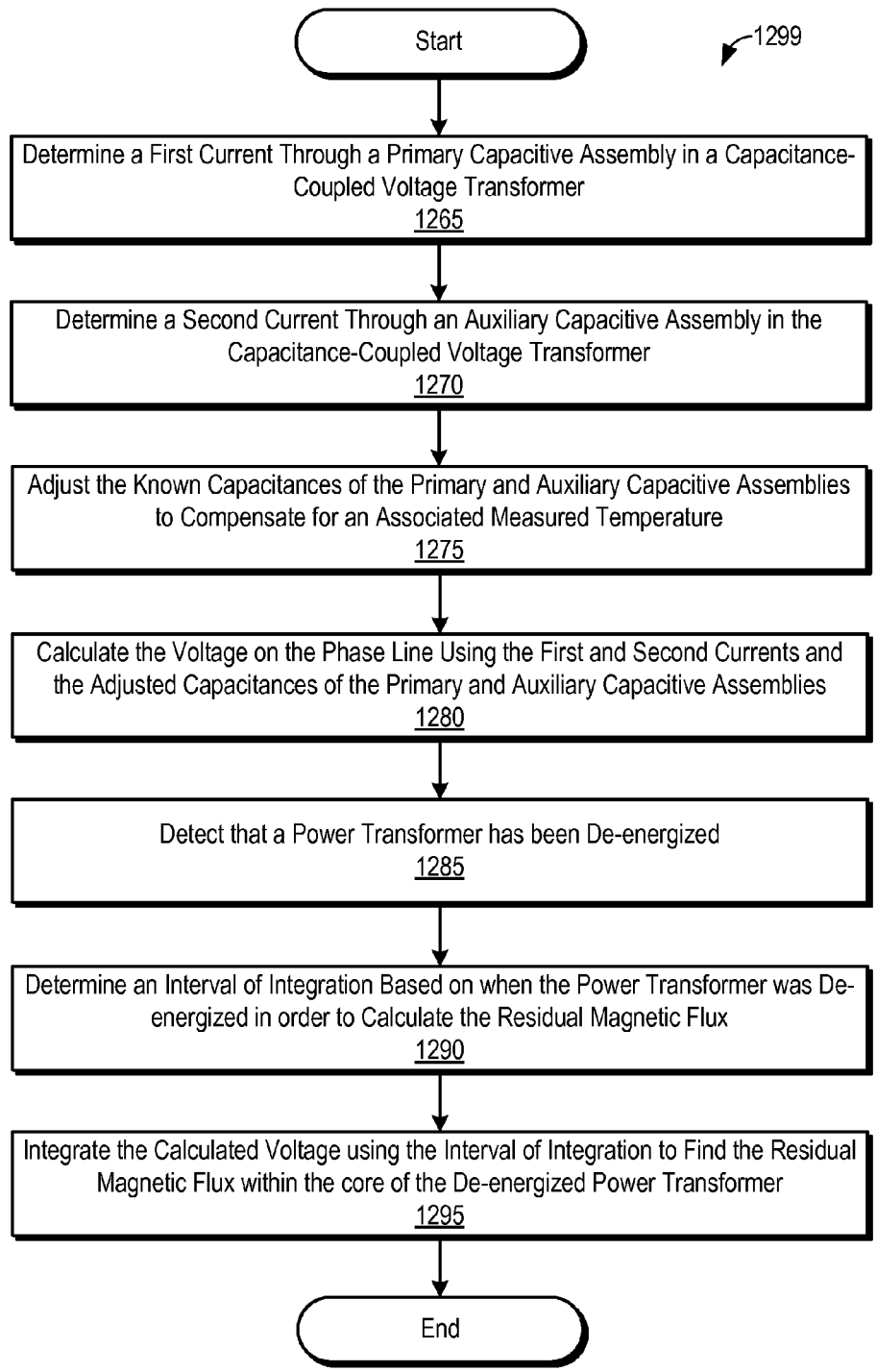
FIG. 12B illustrates a related method that further includes accounting for temperature fluctuations in the CCVT.

FIG. 12B illustrates a method 1299 for accurately determining the residual magnetic flux within the core of a power transformer by adjusting for temperature fluctuations in the current sensors of a CCVT. The method of FIG. 12B is described as being performed by an IED, however, various machines, apparatuses, and/or persons could alternatively perform method 1299. An IED determines the current through the primary capacitive assembly in the CCVT, at 1265. The IED determines the current through the auxiliary capacitive assembly in the CCVT, at 1270.

For purposes of subsequent calculations, the known capacitances of the primary and auxiliary capacitive assemblies may be adjusted to compensate for an associated measured temperature, at 1275. For example, one or more temperature sensors may be used to measure the ambient temperature near a capacitive component in the primary or auxiliary capacitive assemblies. Alternatively, one or more temperature sensors may be used to directly measure the temperature of the primary and/or auxiliary capacitive assemblies. Adjusting the capacitance value of the primary and/or auxiliary capacitive assemblies based on the temperature may provide increased accuracy for subsequent calculations. The actual capacitance may not be adjusted; rather the known capacitance value of the capacitors may be adjusted in the equations based on the measured temperatures.

The IED calculates the voltage on the phase line using the first and second currents and the capacitances of the primary and auxiliary capacitive assemblies, at 1280. The IED may then detect, or receive a signal indicating, that a power transformer connected to the same phase line as the CCVT has been de-energized, at 1285. The IED may determine an interval of integration based on when the power transformer was de-energized in order to calculate the residual magnetic flux within the core of the power transformer, at 1290. The IED may then integrate the calculated voltage using the interval of integration to find the residual magnetic flux within the core of the de-energized power transformer, at 1295.

Again, the current through the primary capacitive assembly and the auxiliary capacitive assembly may be directly measured. Alternatively, current sensors may be positioned at neutral, ground, or low voltage locations in order to reduce the difficulty in obtaining accurate current measurements. Accordingly, the current through the auxiliary capacitive assembly may be measured via a current sensor positioned between the auxiliary capacitive assembly and ground. The current through the primary capacitive assembly may be deduced using the current through the auxiliary capacitive assembly and a current measured between the grounded side of the primary winding and ground.

Figure 13A:
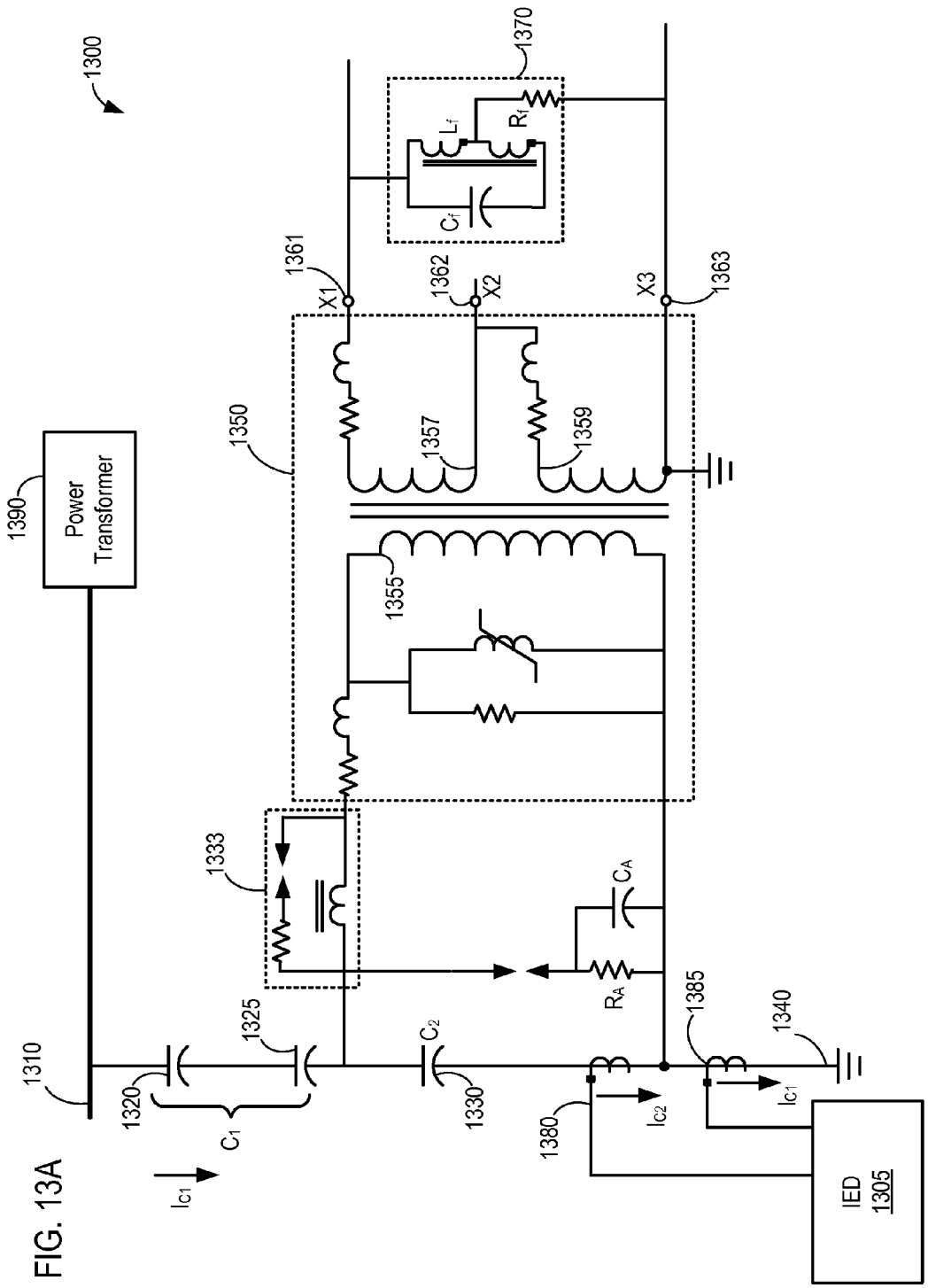
FIG. 13A illustrates a circuit diagram of one embodiment of a CCVT, including two current sensors useful for determining the flux within a core of a power transformer.

FIG. 13A illustrates a circuit diagram of one embodiment of a CCVT 1300, including two current sensors 1380 and 1385 useful for determining the flux within a core of a power transformer 1390. The illustrated CCVT configuration is similar to that described in conjunction with FIG. 2, and may utilize a coupling-capacitor voltage divider or a capacitance-bushing voltage divider, as illustrated in FIGS. 3 and 4 respectively. FIG. 13A illustrates a circuit diagram including the main components of an active single-phase CCVT 1300, including various tuning and protection circuits. CCVT 1300 includes primary capacitive assembly (comprising capacitive elements 1320 and 1325) and auxiliary capacitive assembly 1330. A compensating reactor 1333 may include inductive, capacitive, and/or resistive elements. A ferroresonant suppression circuit (FSC) 1370 may be connected to output terminals X1 1361 and X3 1363 across secondary windings 1357 and 1359. FSC 1370 may reduce or eliminate ferroresonant conditions within the CCVT that might otherwise cause damaging overvoltages and/or overcurrents.

Primary capacitive assembly 1320 and 1325 may couple the high-voltage side of primary winding 1355 to a high-voltage phase line 1310. Auxiliary capacitive assembly 1330 may couple the high voltage side of primary winding 1355 to a neutral point 1340, such as ground. Step down transformer 1350 may include one or more secondary winding 1357 and 1359. Various desired output voltages may be achieved using any number of secondary windings and associated terminals, such as terminals X1 1361, X2 1362, and X3 1363.

The interaction of the various capacitive and reactive elements in CCVT 1300 results in transient errors in the secondary voltage output when it is de-energized. As previously described, the poor transient response of CCVTs makes it difficult or impossible to accurately determine the magnetic flux within the core of power transformer 1390 when it is de-energized. Specifically, while the voltage measured at outputs X1 1361 and X3 1363 may typically be useful for determining the voltage on phase line 1310 that is attached to the primary winding of power transformer 1390, the output voltage of CCVT 1300 is unsuitable to determine the residual flux in the core of power transformer 1390 when it is de-energized.

IED 1305 may be in communication with current sensors 1380 and 1385 configured to measure the current $I_{C2}$ through auxiliary capacitive assembly 1330 and the current $I_{C1}$ through primary capacitive assembly 1320 and 1325, respectively. Measuring currents $I_{C1}$ and $I_{C2}$ and having knowledge of the capacitive values of primary capacitive assembly 1320 and 1325 and auxiliary capacitive assembly 1330 allows for the reconstruction of the voltage of phase line 1310. Calculating the voltage on phase line 1310 using current sensors 1380 and 1385 allows for the calculation of the residual flux in the core of power transformer 1390 following a de-energizing event. As previously described, knowledge of the residual flux in a de-energized transformer can be used to considerably reduce the transient inrush current during the subsequent re-energization of the transformer core.

To calculate the voltage of phase line 1310, the following equation can be used:

$$V = jI_{C1}X_{C1} + jI_{C2}X_{C2} \qquad \text{Equation 1}$$

In equation 1 above, V is the voltage of phase line 1310, $I_{C1}$ is the current in primary capacitive assembly 1320 and 1325, $I_{C2}$ is the current in auxiliary capacitive assembly 1330, $X_{C1}$ is the capacitive reactance of primary capacitive assembly 1320 and 1325, and $X_{C2}$ is the capacitive reactance of auxiliary capacitive assembly 1330. In the time domain, equation 1 can be expressed as:

$$v(t) = \frac{1}{c_1}\int i_{C1}dt + \frac{1}{c_2}\int i_{C2}dt \qquad \text{Equation 2}$$

In equation 2 above, V(t) is the instantaneous voltage of phase line 1310, $i_{C1}$ is the instantaneous current in primary capacitive assembly 1320 and 1325, $i_{C2}$ is the instantaneous current in auxiliary capacitive assembly 1330, $C_1$ is the capacitance of primary capacitive assembly 1320 and 1325, and $C_2$ is the capacitance of auxiliary capacitive assembly 1330.

FIG. 13A illustrates one possible configuration of a CCVT 1300 and one possible location for positioning current sensors 1380 and 1385. It should be apparent to one of skill in the art that two or more current sensors may be placed a varying locations within the circuit diagram of FIG. 13A and still allow for the calculation of the currents through the primary and auxiliary capacitive assemblies. Specifically, using the electrical principles described in Kirchhoff's first and second laws, currents sensors 1380 and 1385 may be placed in a wide variety of locations. Kirchhoff's laws may be adapted to account for Faraday's law of induction related to the inductors associated with CCVT 1300 by associating a potential drop or electromotive force with each inductor in the circuit (e.g., primary winding 1355).

Figure 13B:
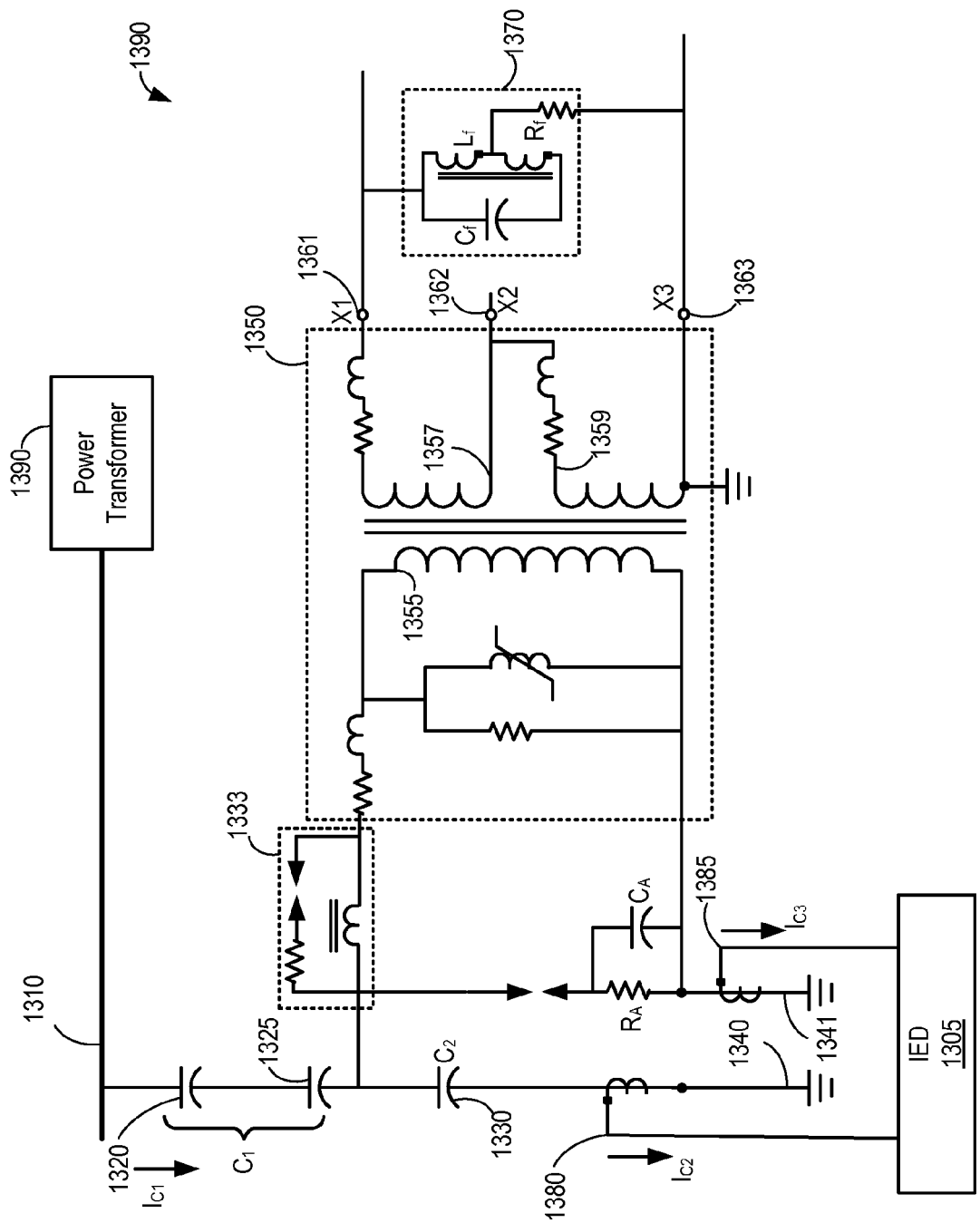
FIG. 13B illustrates a circuit diagram of another embodiment of a CCVT, including two current sensors useful for determining the flux within the core of the power transformer.

FIG. 13B illustrates a circuit diagram of another embodiment of a CCVT 1390, in which a neutral connection 1341 of primary winding 1355 of transformer 1350 is not shared with neutral connection 1340 of auxiliary capacitive assembly 1330. The other components are similar to those described in conjunction with FIG. 13A having similar reference numbers. According to the embodiment illustrated in FIG. 13B, IED 1305 may receive current measurements $I_{C2}$ and $I_{C3}$. $I_{C2}$ corresponds to the current through the auxiliary capacitive assembly. IED 1305 may derive the current, $I_{C1}$, through primary capacitive assembly 1320 and 1325 using $I_{C2}$ and $I_{C3}$.

Measuring or deriving currents $I_{C1}$ and $I_{C2}$ and having knowledge of the capacitive values of primary capacitive assembly 1320 and 1325 and auxiliary capacitive assembly 1330 allows for the reconstruction of the voltage of phase line 1310 using equations 1 and/or 2 above. Knowing the voltage of phase line 1310 allows for the calculation of the residual flux in the core of power transformer 1390 following a de-energizing event. As previously described, knowledge of the residual flux in a de-energized power transformer 1390 can be used to considerably reduce the transient inrush current during the subsequent re-energization of power transformer 1390.

Figure 13C:
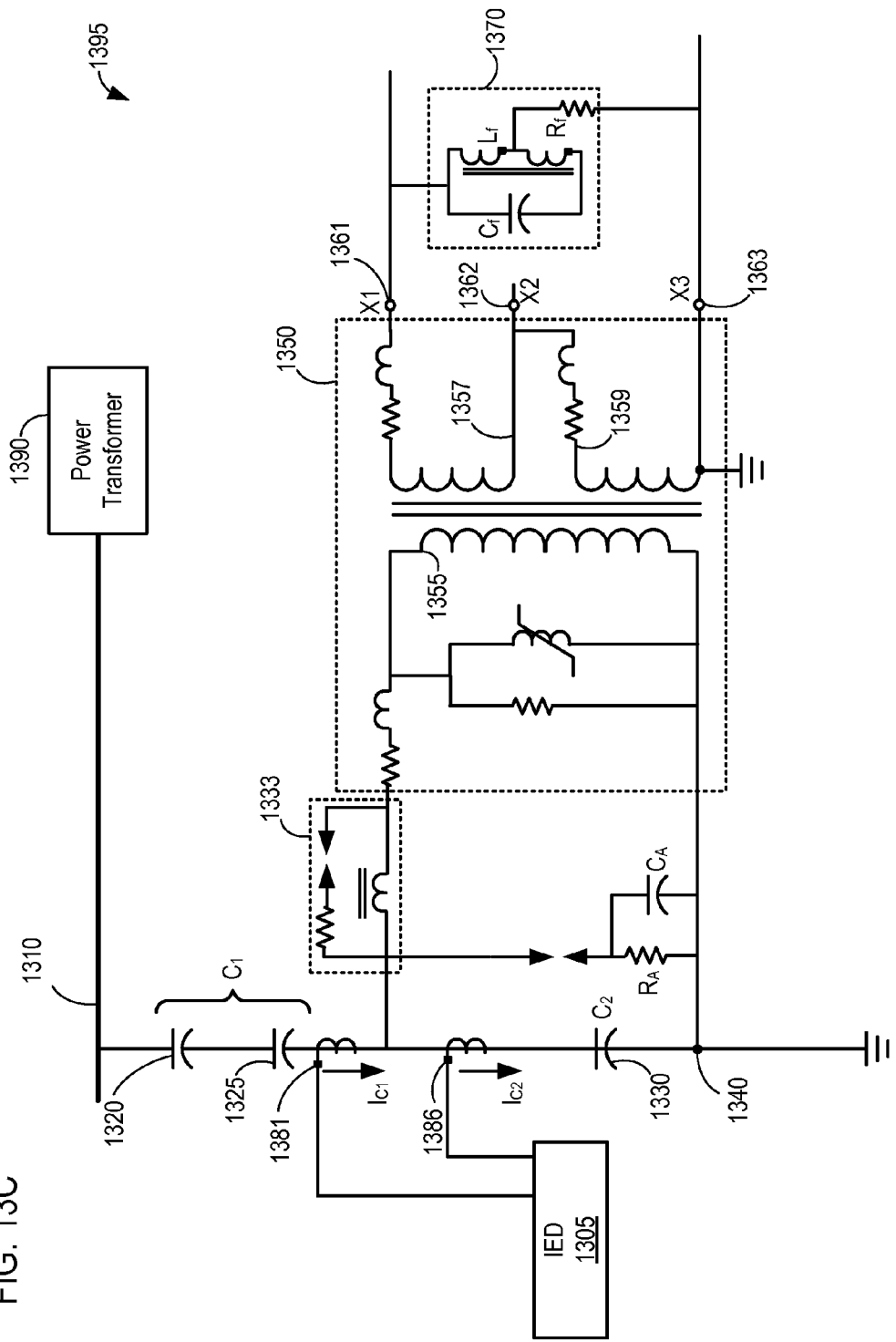
FIG. 13C illustrates a circuit diagram of another embodiment of a CCVT, including two high-voltage current sensors useful for determining the flux within the core of the power transformer.

FIG. 13C illustrates a circuit diagram of another embodiment of a CCVT 1395, including two high-voltage current sensors 1381 and 1386 configured to directly measure the current through primary capacitive assembly 1320 and 1325 and auxiliary capacitive assembly 1330. The other components of CCVT 1395 are similar to those described in conjunction with FIG. 13A having similar reference numbers. IED 1305 may receive the current measurement made by high-voltage current sensors 1381 and 1386. The IED 1305 may then reconstruct the voltage of phase line 1310 using equations 1 and/or 2 above. The IED 1305 may then calculate the residual flux in the core of power transformer 1390 following a de-energizing event in order to facilitate an optimized re-energization of power transformer 1390 at a later time.

A primary advantage of the embodiments illustrated in FIGS. 13A and 13B is that current sensors 1380 and 1385 are located at a zero-voltage location in the respective CCVTs 1300 and 1390. Accordingly, the cost and size of current sensors 1380 and 1385 may be significantly lower than high-voltage current sensors 1381 and 1386. However, any of the configurations shown in FIGS. 13A-13C may be used in conjunction with presently described systems and methods. Additionally, current sensors may be positioned in any of a wide variety of locations in a CCVT, so long as they provide sufficient information for an IED to calculate or derive the current through each of the primary and auxiliary capacitive assemblies.

Figure 14:
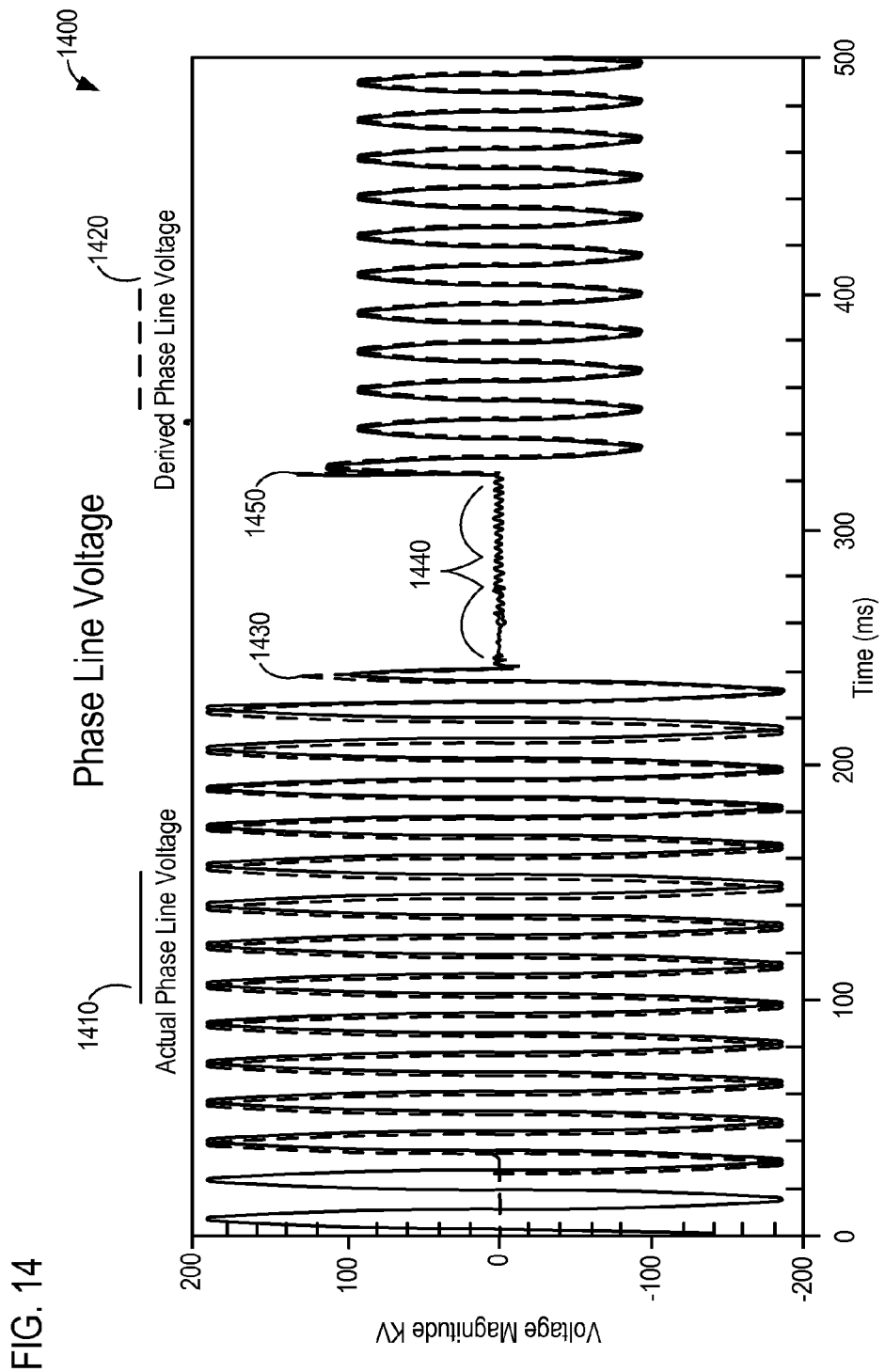
FIG. 14 illustrates an oscillographic comparison of the actual phase line voltage and the phase line voltage derived using measurements taken from two current sensors in a CCVT.

FIG. 14 illustrates an oscillographic comparison 1400 of an actual phase line voltage 1410 at the primary winding and a phase line voltage derived (derived phase line voltage 1420) using measurements taken from two current sensors. For example, derived phase line voltage 1420 may be determined using currents sensors 1380 and 1385 as illustrated in one of FIG. 13A or 13B. As illustrated, actual phase line voltage 1410 and derived phase line voltage 1420 are nearly identical prior to a de-energizing event, at 1430, while the power transformer is de-energized, at 1440, and following a re-energizing event, at 1450.

Figure 15:
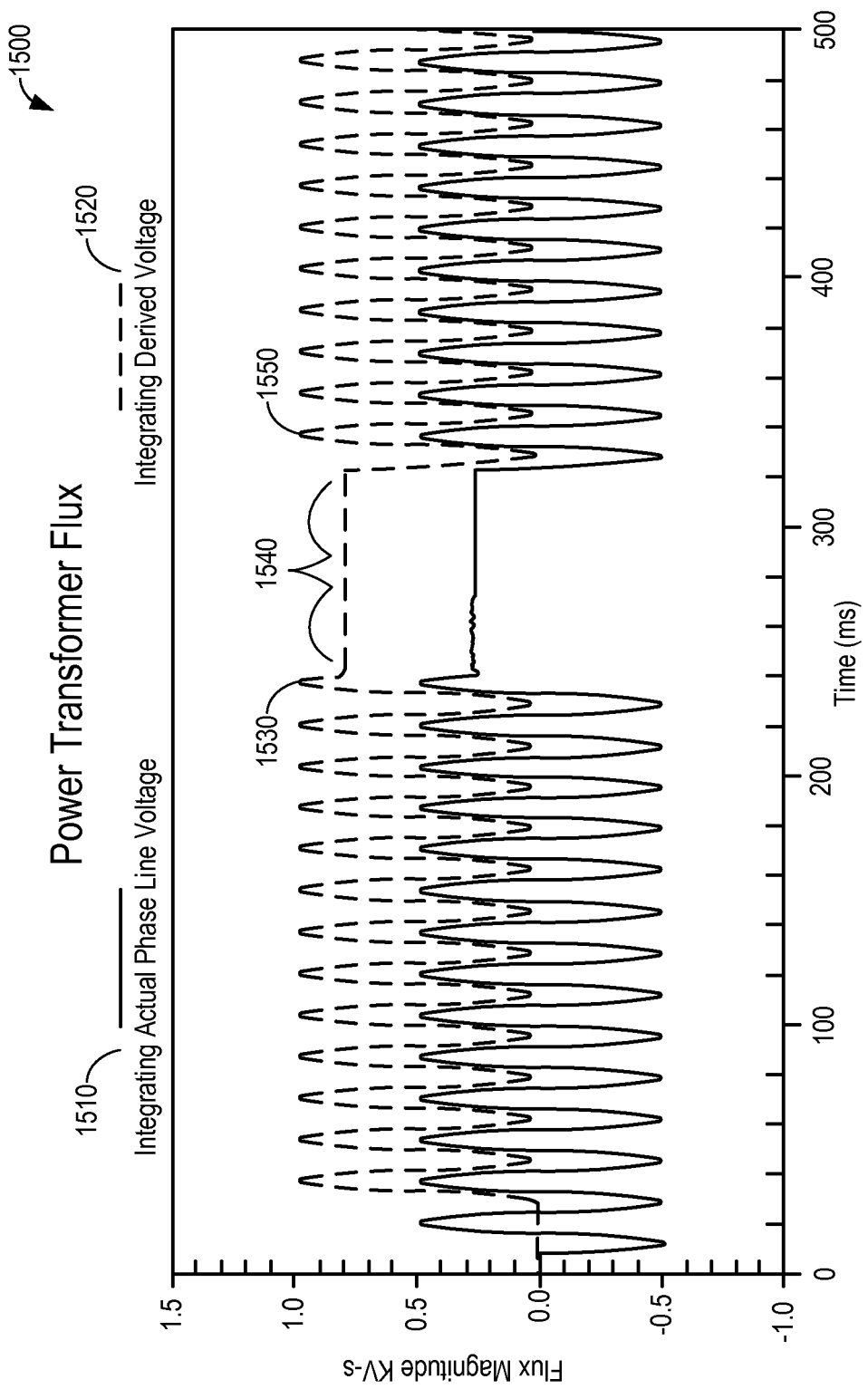
FIG. 15 illustrates an oscillographic comparison of the actual power transformer flux and the power transformer flux calculated by integrating the derived phase line voltage.

FIG. 15 illustrates an oscillographic comparison 1500 of the actual flux 1510 in the core of a power transformer and a derived flux in the power transformer calculated by integrating a derived phase line voltage (derived transformer flux 1520). Actual transformer flux 1510 alternates between approximately 0.5 KV-s and −0.5 KV-s, while derived transformer flux 1520 is nearly identical but biased by 0.5 KV-s. Other than the bias, actual phase line flux 1510 and derived transformer flux 1520 are equivalent. Most significantly, after a de-energizing event, at 1530, derived transformer flux 1520 remains identical to actual transformer flux 1510. Accordingly, actual phase line flux 1510 and derived transformer flux 1520 indicate an equivalent residual flux, while the transformer is de-energized, at 1540 (ignoring the bias). By contrasting FIG. 6 with FIG. 15, it can be seen that while the output voltage of the CCVT cannot be used to accurately derive the transformer flux (620 in FIG. 6), the current measured (or derived) through the primary and auxiliary capacitive assemblies of the CCVT can be used to accurately calculate the flux in the core of a power transformer. Specifically, the output voltage of the CCVT cannot be used to find the residual flux in a de-energized power transformer. In contrast, and as illustrated in FIG. 15, the voltage calculated using the current measured (or derived) through the primary and auxiliary capacitive assemblies of the CCVT can be used to accurately find the residual flux in a de-energized power transformer.

The bias illustrated in FIG. 15 may be introduced based on the choice of the starting point of an interval of integration. As may be appreciated by one of skill in the art, the flux should alternate between positive and negative values such that the net flux is 0. Accordingly, a controlled integration may be performed in order to eliminate the bias. The controlled integration may comprise applying a filter to eliminate the bias, shifting the integral by a constant value to eliminate the bias, and/or adjusting the interval of integration to eliminate the bias.

Figure 16:
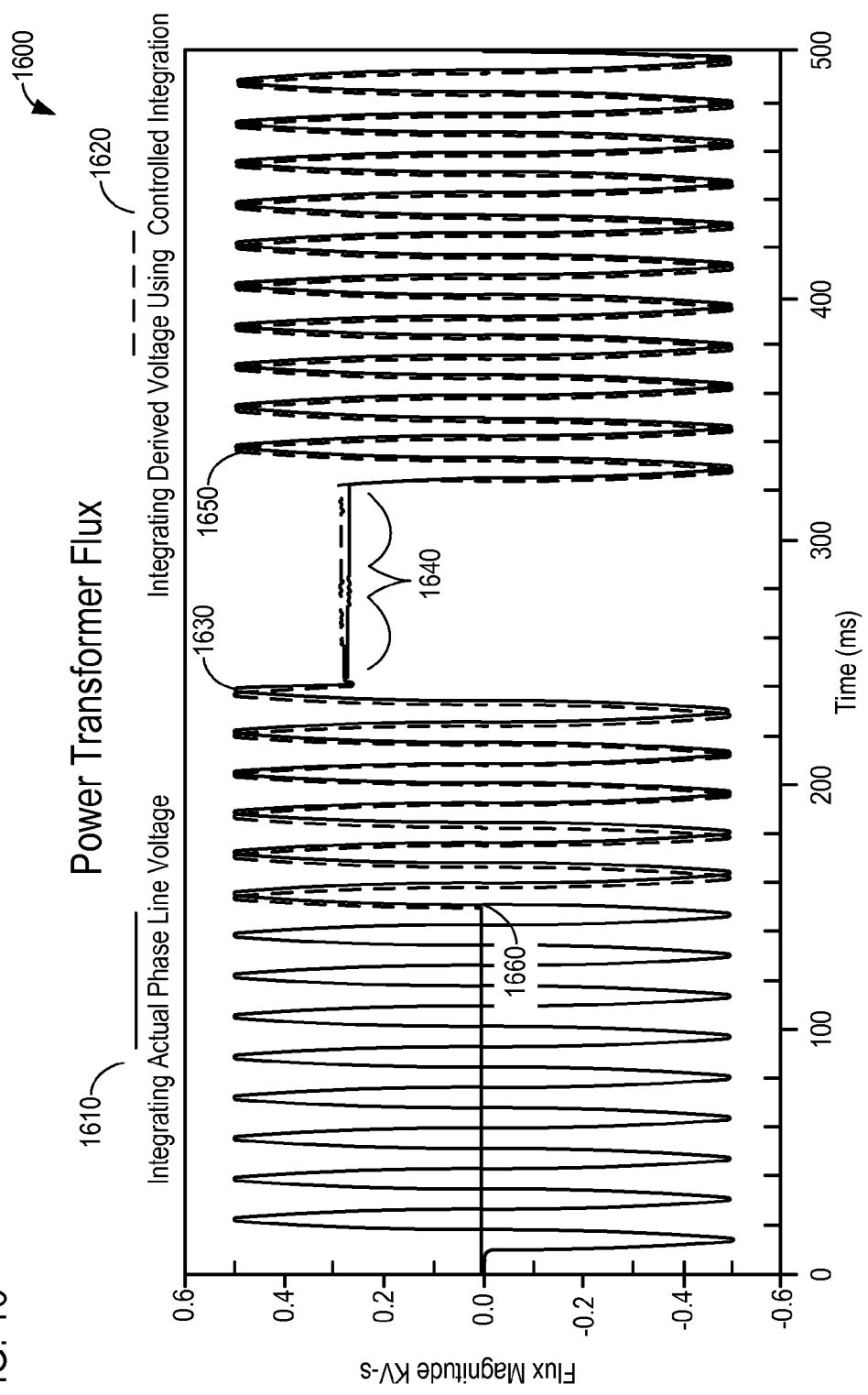
FIG. 16 illustrates an oscillographic comparison of the actual power transformer flux and the transformer flux calculated using controlled integration of the derived phase line voltage.

FIG. 16 illustrates an oscillographic comparison 1600 of an actual transformer flux 1610 and a transformer flux calculated using the derived phase line voltage (derived transformer flux 1620), where derived transformer flux 1620 is calculated using controlled integration. In the illustrated embodiment, the interval of integration is adjusted to eliminate the bias, as evidenced by the 0 magnitude of derived transformer flux 1620 until approximately 150 ms, at 1660. Using the controlled integration, derived transformer flux 1620 is equivalent or nearly equivalent to actual transformer flux 1610 following the de-energizing event 1630. Similarly, the residual transformer flux, at 1640, is nearly identical. Using the magnitude and polarity of the residual flux, the transformer undergoes an optimized re-energization event, at 1650, minimizing the inrush currents.

The above description provides numerous specific details for a thorough understanding of the embodiments described herein. However, those of skill in the art will recognize that one or more of the specific details may be omitted, modified, and/or replaced by a similar process or system.

What is claimed:

1. A method for determining the magnetic flux in a power transformer, comprising:
- determining a first current through a primary capacitive assembly, the primary capacitive assembly positioned between a phase line and a primary winding of a capacitance-coupled voltage transformer (CCVT);
- determining a second current through an auxiliary capacitive assembly, the auxiliary capacitive assembly positioned between the primary capacitive assembly and a reference line;
- calculating a voltage on the phase line using the first current, the second current, the known capacitance of the primary capacitive assembly, and the known capacitance of the auxiliary capacitive assembly;
- integrating the calculated voltage on the phase line to determine the magnetic flux within a core of a power transformer;
- detecting that the power transformer has been de-energized; and
- adjusting the interval of integration based on when the power transformer was de-energized in order to calculate a residual magnetic flux in the core of the de-energized power transformer.

2. The method of claim 1, wherein the reference line is a ground line.

3. The method of claim 1, wherein the reference line is a second phase line in a three-phase power system.

4. The method of claim 1, wherein the primary capacitive assembly comprises a first capacitive element and a second capacitive element connected in series.

5. The method of claim 1, wherein the primary capacitive assembly and the auxiliary capacitive assembly are part of a coupling-capacitor voltage divider, the tap of the coupling-capacitor voltage divider connected to the primary winding of the CCVT.

6. The method of claim 1, wherein the primary capacitive assembly and the auxiliary capacitive assembly are part of a capacitance-bushing voltage divider, the tap of the capacitance-bushing voltage divider connected to the primary winding of the CCVT.

7. The method of claim 1, wherein determining the second current through the auxiliary capacitive assembly comprises measuring the second current using an auxiliary current sensor positioned between the reference line and the auxiliary capacitive assembly; and
- wherein determining the first current through the primary capacitive assembly comprises deriving the first current using the second current and a third current measured using a primary current sensor positioned between the primary winding of the CCVT and the reference line.

8. The method of claim 1, wherein integrating the voltage on the phase line comprises a controlled integration.

9. The method of claim 8, wherein the controlled integration comprises adjusting the interval of integration to eliminate a bias.

10. The method of claim 8, wherein the controlled integration comprises shifting the integral by a constant value to eliminate a bias.

11. The method of claim 8, wherein the controlled integration comprises applying a filter to eliminate a bias.

12. The method of claim 1, wherein calculating the voltage on the phase line further comprises:
- adjusting the known capacitance of the primary capacitive assembly to compensate for a measured temperature associated with the primary capacitive assembly; and
- adjusting the known capacitance of the auxiliary capacitive assembly to compensate for a measured temperature associated with the auxiliary capacitive assembly.

13. An intelligent electronic device (IED) configured to determine magnetic flux in a power transformer, comprising:
- a processor; and
- a memory in communication with the processor, the memory comprising instructions executable by the processor configured to cause the processor to:
  - receive a first current value from a first current sensor, the first current value corresponding to an electric current through a primary capacitive assembly positioned between a phase line and a primary winding of a capacitance-coupled voltage transformer (CCVT);
  - receive a second current value from a second current sensor, the second current value corresponding to an electric current through an auxiliary capacitive assembly, the auxiliary capacitive assembly positioned between the primary capacitive assembly and a reference line;
  - calculate a voltage on the phase line using the first current value, the second current value, a known capacitance of the primary capacitive assembly, and a known capacitance of the auxiliary capacitive assembly;
  - integrate the calculated voltage on the phase line to determine the magnetic flux within a core of a power transformer;
  - detect that the power transformer has been de-energized; and
  - adjust the interval of integration based on when the power transformer was de-energized in order to calculate a residual magnetic flux in the core of the de-energized power transformer.

14. The IED of claim 13, wherein the reference line comprises a ground line.

15. The IED of claim 13, wherein the reference line comprises a second phase line in a three-phase power system.

16. The IED of claim 13, wherein the primary capacitive assembly comprises a first capacitive element and a second capacitive element connected in series.

17. The IED of claim 13, wherein the primary capacitive assembly and the auxiliary capacitive assembly are part of a coupling-capacitor voltage divider, the tap of the coupling-capacitor voltage divider connected to the primary winding of the CCVT.

18. The IED of claim 13, wherein the primary capacitive assembly and the auxiliary capacitive assembly are part of a capacitance-bushing voltage divider, the tap of the capacitance-bushing voltage divider connected to the primary winding of the CCVT.

19. The IED of claim 13, wherein the second current sensor is positioned between the reference line and the auxiliary capacitive assembly, so as to directly measure the electric current through the auxiliary capacitive assembly; and
- wherein the first current sensor is positioned between the primary winding of the CCVT and the reference line, such that the IED may derive the electric current through the primary capacitive assembly using the first current value and the second current value.

20. The IED of claim 13, wherein the IED is configured to integrate the voltage on the phase line using controlled integration.

21. The IED of claim 20, wherein the controlled integration comprises adjusting the interval of integration to eliminate a bias.

22. The IED of claim 20, wherein the controlled integration comprises shifting the integral by a constant value to eliminate a bias.

23. The IED of claim 20, wherein the controlled integration comprises applying a filter to eliminate a bias.

24. The IED of claim 13, wherein the instructions are further configured to cause the processor to:
adjust the known capacitance of the primary capacitive assembly to compensate for a measured temperature associated with the primary capacitive assembly; and
adjust the known capacitance of the auxiliary capacitive assembly to compensate for a measured temperature associated with the auxiliary capacitive assembly.

25. A method for determining magnetic flux in a power transformer, comprising:
an intelligent electronic device (IED) receiving a first current value from a first current sensor, the first current value corresponding to an electric current through a primary capacitive assembly, the primary capacitive assembly positioned between a phase line and a primary winding of a capacitance-coupled voltage transformer (CCVT);
the IED receiving a second current value from a second current sensor, the second current value corresponding to an electric current through an auxiliary capacitive assembly, the auxiliary capacitive assembly positioned between the primary capacitive assembly and a reference line;
the IED calculating a voltage on the phase line using the first current value, the second current value, a capacitance of the primary capacitive assembly, and a capacitance of the auxiliary capacitive assembly;
the IED integrating the calculated voltage on the phase line to determine the magnetic flux within a core of a power transformer;
the IED detecting that the power transformer has been de-energized; and
the IED adjusting the interval of integration based on when the power transformer was de-energized in order to calculate a residual magnetic flux in the core of the de-energized power transformer.

26. An intelligent electronic device (IED) configured to determine magnetic flux in a power transformer, comprising:
a processor; and
a memory in communication with the processor, the memory comprising instructions executable by the processor configured to cause the processor to:
receive a first current value from a first current sensor, the first current value corresponding to an electric current through a primary capacitive assembly positioned between a phase line and a primary winding of a capacitance-coupled voltage transformer (CCVT);
receive a second current value from a second current sensor, the second current value corresponding to an electric current through an auxiliary capacitive assembly, the auxiliary capacitive assembly positioned between the primary capacitive assembly and a reference line;
calculate a voltage on the phase line using the first current value, the second current value, a known capacitance of the primary capacitive assembly, and a known capacitance of the auxiliary capacitive assembly; and,
integrate the calculated voltage on the phase line to determine the magnetic flux within a core of a power transformer;
wherein the second current sensor is positioned between the reference line and the auxiliary capacitive assembly, so as to directly measure the electric current through the auxiliary capacitive assembly; and;
wherein the first current sensor is positioned between the primary winding of the CCVT and the reference line, such that the IED may derive the electric current through the primary capacitive assembly using the first current value and the second current value.

27. An intelligent electronic device (IED) configured to determine magnetic flux in a power transformer, comprising:
a processor; and
a memory in communication with the processor, the memory comprising instructions executable by the processor configured to cause the processor to:
receive a first current value from a first current sensor, the first current value corresponding to an electric current through a primary capacitive assembly positioned between a phase line and a primary winding of a capacitance-coupled voltage transformer (CCVT);
receive a second current value from a second current sensor, the second current value corresponding to an electric current through an auxiliary capacitive assembly, the auxiliary capacitive assembly positioned between the primary capacitive assembly and a reference line;
calculate a voltage on the phase line using the first current value, the second current value, a known capacitance of the primary capacitive assembly, and a known capacitance of the auxiliary capacitive assembly;
integrate the calculated voltage on the phase line to determine the magnetic flux within a core of a power transformer;
adjust the known capacitance of the primary capacitive assembly to compensate for a measured temperature associated with the primary capacitive assembly; and,
adjust the known capacitance of the auxiliary capacitive assembly to compensate for a measured temperature associated with the auxiliary capacitive assembly.

\* \* \* \* \*